(12) United States Patent
Kwon et al.

(10) Patent No.: US 9,449,686 B2
(45) Date of Patent: Sep. 20, 2016

(54) RESISTIVE MEMORY DEVICE, RESISTIVE MEMORY SYSTEM AND METHOD OF OPERATING THE RESISTIVE MEMORY DEVICE

(71) Applicant: SAMSUNG ELECTRONICS CO., LTD., Suwon-Si, Gyeonggi-Do (KR)

(72) Inventors: Hyo-Jin Kwon, Seoul (KR); Yeong-Taek Lee, Seoul (KR); Dae-Seok Byeon, Seongnam-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/743,488

(22) Filed: Jun. 18, 2015

(65) Prior Publication Data

US 2016/0118114 A1    Apr. 28, 2016

(30) Foreign Application Priority Data

Oct. 28, 2014  (KR) .................. 10-2014-0147627

(51) Int. Cl.
*G11C 11/00* (2006.01)
*G11C 13/00* (2006.01)

(52) U.S. Cl.
CPC ......... *G11C 13/004* (2013.01); *G11C 13/0069* (2013.01)

(58) Field of Classification Search
CPC .................. G11C 13/004; G11C 13/0069
See application file for complete search history.

(56) References Cited

U.S. PATENT DOCUMENTS

| | | |
|---|---|---|
| 7,248,494 B2 | 7/2007 | Oh et al. |
| 7,405,960 B2 | 7/2008 | Cho et al. |
| 7,486,549 B2 | 2/2009 | Hidaka |
| 7,885,100 B2 | 2/2011 | Park |
| 8,144,500 B2 | 3/2012 | Kono |
| 8,248,838 B2 | 8/2012 | Tonomura |
| 8,477,525 B2 | 7/2013 | Ito |
| 8,508,975 B2 | 8/2013 | Toba et al. |
| 8,582,346 B2 | 11/2013 | Maejima et al. |
| 2011/0069524 A1* | 3/2011 | Toba et al. ............ 365/63 |
| 2013/0148406 A1* | 6/2013 | Shimakawa et al. ...... 365/148 |
| 2013/0223133 A1 | 8/2013 | Azuma et al. |
| 2014/0347912 A1* | 11/2014 | Siau et al. ............ 365/148 |
| 2015/0043271 A1* | 2/2015 | Ong .................. 365/158 |

* cited by examiner

*Primary Examiner* — Khamdan Alrobaie
*Assistant Examiner* — Mohammed A Bashar
(74) *Attorney, Agent, or Firm* — Volentine & Whitt, PLLC

(57) ABSTRACT

A method of operating a resistive memory device and a resistive memory system including a resistive memory device is for a resistive memory device including a plurality of bit lines and at least one dummy bit line. The method of operating the resistive memory device includes detecting a first address accompanying a first command, generating a plurality of inhibit voltages for biasing non-selected lines, and providing to a first dummy bit line a first inhibit voltage selected from among the plurality of inhibit voltages based on a result of detecting the first address.

20 Claims, 19 Drawing Sheets

FIG. 9

|      | Left BL sel    | Right BL sel   |
|------|----------------|----------------|
| DBL1 | Bias level ↓   | Bias level ↑   |
| DBL2 | Bias level ↓   | Bias level ↑   |

RESISTIVE MEMORY DEVICE, RESISTIVE MEMORY SYSTEM AND METHOD OF OPERATING THE RESISTIVE MEMORY DEVICE

CROSS-REFERENCE TO RELATED APPLICATIONS

A claim for priority under 35 U.S.C. §119 is made to Korean Patent Application No. 10-2014-0147627, filed on Oct. 28, 2014, in the Korean Intellectual Property Office, the disclosure of which is incorporated herein in its entirety by reference.

BACKGROUND

The inventive concepts described herein relate to resistive memory devices, and more particularly, to resistive memory devices including dummy lines, resistive memory systems, and methods of operating resistive memory devices.

In view of the demand for high capacity, low power consumption memory devices, research for next-generation memory devices has been directed to non-volatile memory devices that do not require refresh operations. Such next-generation memory devices should have the high integrity characteristics of Dynamic Random Access Memory (DRAM), the non-volatile characteristics of flash memory, and the high speed of a static RAM (SRAM). Consequently, memory devices including Phase change RAM (PRAM), Nano Floating Gate Memory (NFGM), Polymer RAM (PoRAM), Magnetic RAM (MRAM), Ferroelectric RAM (FeRAM), and Resistive RAM (RRAM) have been considered as next-generation memory devices.

SUMMARY

Embodiments of the inventive concept provide a resistive memory device that reduces a leakage current generated in dummy cells connected to a dummy line, a resistive memory system including the resistive memory device, and a method of operating the resistive memory device.

Embodiments of the inventive concept provide a method of operating a resistive memory device, wherein the resistive memory device includes a plurality of bit lines and at least one dummy bit line. The method includes detecting a first address accompanying a first command related to a memory operation of the resistive memory device, generating a plurality of inhibit voltages for biasing non-selected lines from among the plurality of bit lines, and providing to a first dummy bit line from among the at least one dummy bit line a first inhibit voltage selected from among the plurality of inhibit voltages based on a result of detecting the first address.

Embodiments of the inventive concept provide a method of operating a resistive memory device, wherein the resistive memory device includes a plurality of signal lines and a dummy line. The method includes receiving a command and an address related to a memory operation of the resistive memory device, detecting the received address to determine a position of a selected signal line from among the plurality of signal lines, and applying a selection voltage to the selected signal line, and a plurality of inhibit voltages to a plurality of non-selected signal lines from among the plurality of signal lines. One of the plurality of inhibit voltages is provided to the dummy line, and the inhibit voltage provided to the dummy line is changed when the detected position of the selected signal line is changed.

Embodiments of the inventive concept provide a memory device including a memory cell array comprising a plurality of memory cells, a plurality of bit lines and at least one dummy bit line; an address detector configured to detect an address indicative of a memory cell to be accessed from among the plurality of memory cells; a power generator configured to generate a plurality of inhibit voltages; and a selector configured to select a first inhibit voltage from among the plurality of inhibit voltages responsive to the detected address and provide the first inhibit voltage to the at least one dummy bit line.

BRIEF DESCRIPTION OF THE DRAWINGS

Exemplary embodiments of the inventive concept will be more clearly understood from the following detailed description taken in conjunction with the accompanying drawings in which:

FIG. 9 is a table showing examples of adjusting an inhibit voltage provided to a dummy line;

DETAILED DESCRIPTION

Figure 1:
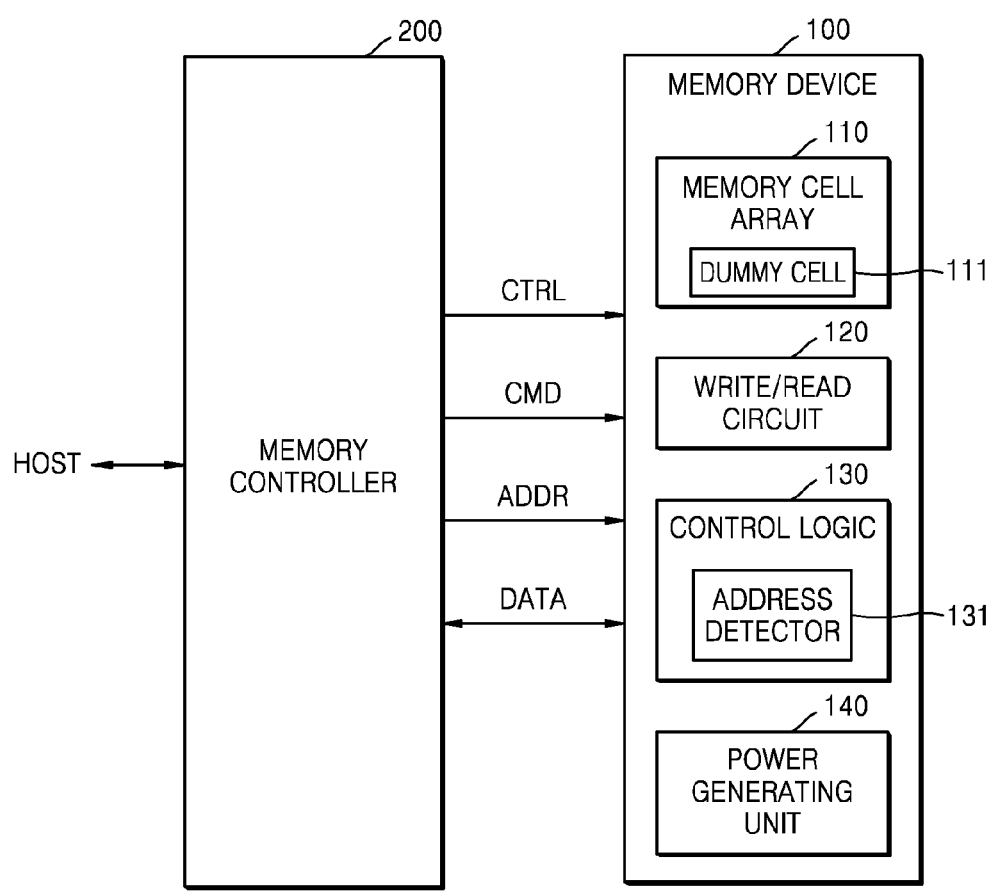
FIG. 1 is a block diagram illustrating a memory system including a memory device, according to an embodiment of the inventive concept.

The inventive concept will now be described more fully with reference to the accompanying drawings, in which exemplary embodiments of the inventive concept are shown. The inventive concept may, however, be embodied in many different forms, and should not be construed as being limited to the embodiments set forth herein. Thus, the inventive concept may include all revisions, equivalents, or substitutions which are included in the concept and the technical scope related to the present inventive concept. Like reference numerals in the drawings denote like elements. In the drawings, the dimension of structures may be exaggerated for clarity.

Furthermore, all examples and conditional language recited herein are to be construed as being without limitation to such specifically recited examples and conditions. Throughout the specification, a singular form may include plural forms, unless there is a particular description contrary thereto. Also, terms such as "comprise" or "comprising" are used to specify existence of a recited form, a number, a process, an operation, a component, and/or groups thereof, not excluding the existence of one or more other recited forms, one or more other numbers, one or more other processes, one or more other operations, one or more other components and/or groups thereof.

While terms "first" and "second" may be used to describe various components, it is obvious that the various components should not be limited to the terms "first" and "second". The terms "first" and "second" are used only to distinguish between each component. For example, a first component may indicate a second component or a second component may indicate a first component without conflicting with the inventive concept.

Unless expressly described otherwise, all terms including descriptive or technical terms which are used herein should be construed as having meanings that are obvious to one of ordinary skill in the art. Also, terms that are defined in a general dictionary and that are used in the following description should be construed as having meanings that are equivalent to meanings used in the related description, and unless expressly described otherwise herein, the terms should not be construed as being ideal or excessively formal.

As used herein, the term "and/or" includes any and all combinations of one or more of the associated listed items. Expressions such as "at least one of," when preceding a list of elements, modify the entire list of elements and do not modify the individual elements of the list.

FIG. 1 is a block diagram illustrating a memory system 10 including a memory device 100 and a memory controller 200, according to an embodiment of the inventive concept. According to embodiments of the inventive concept, the memory device 100 may include resistive memory cells and may be referred to as a resistive memory device. In other embodiments, memory device 100 may alternatively include various other types of memory cells. In embodiments of the inventive concept, the memory cells of memory device 100 may be disposed in regions where a plurality of first signal lines and a plurality of second signal lines cross each other, and memory device 100 may thus be referred to as a cross-point memory device. Hereinafter, the memory device 100 according to embodiments of the inventive concept will be described as a resistive memory device.

Referring to FIG. 1, the memory system 10 includes the memory device 100 and a memory controller 200. The memory device 100 includes a memory cell array 110, a write/read circuit 120, a control logic 130, and a power generating unit 140, in embodiments where the memory cell array 110 includes resistive memory cells, memory system 10 includes resistive memory cells, memory system 10 may be characterized as a resistive memory system.

In response to a write/read request from a host, the memory controller 200 may read data stored in the memory device 100 or may control the memory device 100 to write data to the memory device 100. In more detail, the memory controller 200 may provide an address ADDR, a command CMD, and a control signal CTRL to the memory device 100 and thus may control a program (or write) operation and a read operation with respect to the memory device 100. Also, write-target data DATA and read data DATA may be exchanged between the memory controller 200 and the memory device 100.

Although not illustrated, the memory controller 200 may include a Random Access Memory (RAM), a processing unit, a host interface, and a memory interface. The RAM may be used as an operation memory of the processing unit. The processing unit may control operations of the memory controller 200. The host interface may include a protocol for exchanging data between the host and the memory controller 200. For example, the memory controller 200 may communicate with an external source (i.e., the host) using at least one of various interface protocols including Universal Serial Bus (USB), Multi Media Card (MMC), Peripheral Component Interconnect Express (PCI-E), Advanced Technology Attachment (ATA), Serial-ATA, Parallel-ATA, Small Computer System Interface (SCSI), Enhanced Small Disk Interface (ESDI), and Integrated Drive Electronics (IDE).

The memory cell array 110 may include a plurality of memory cells (not shown) that are disposed respectively in regions where a plurality of first signal lines and a plurality of second signal lines cross each other. In the present embodiment, the plurality of first signal lines include a plurality of bit lines, and the plurality of second signal lines include a plurality of word lines. In other embodiments, the first signal lines may be word lines, and the second signal lines may be bit lines.

In the present embodiment, each of the memory cells may be a single level cell (SLC) that stores one bit data, or may be a multilevel cell (MLC) that may store at least two-bit data. Alternatively, the memory cell array 110 may include both SLCs and MLCs. In embodiments of the inventive concept, when one bit data is written to an SLC memory cell, the memory cell may have two resistance level distributions according to the written data. Alternatively, when two-bit data is written to an MLC memory cell, the memory cell may have four resistance level distributions according to the written data. In other embodiments, if a memory cell is a triple level cell (TLC) that stores three-bit data, the memory cells may have eight resistance level distributions according to the written data. However, embodiments of the inventive concept are not limited thereto, and according to other embodiments each of the memory cells may store at least four-bit data.

According to embodiments of the inventive concept, the memory cell array 110 may include memory cells with a two-dimensional horizontal structure. According to other embodiments, the memory cell array 110 may include memory cells with a three-dimensional vertical structure.

The memory cell array 110 may include resistive memory cells that include a variable resistor device (not shown), and in such a case memory device 100 may be a resistive memory device as described previously. In some embodiments, if the variable resistor device includes a phase change material such as Ge—Sb—Te for example which has a resistance that is changed according to temperature, the resistive memory device may be a Phase change RAM (PRAM). In other embodiments, if the variable resistor device includes a complex metal oxide including an upper electrode, a lower electrode, and transition metal oxide therebetween, the resistive memory device may be a Resistive RAM (RRAM). In other embodiments, if the variable resistor device includes an upper electrode of a magnetic material, a lower electrode of the magnetic material, and a dielectric therebetween, the resistive memory device may be a Magnetic RAM (MRAM).

The write/read circuit 120 performs write and read operations on the memory cells. The write/read circuit 120 is connected to the memory cells via bit lines, and may include a write driver that writes data to the memory cells and a sense amplifier that senses a resistance component of the memory cells.

The control logic 130 controls overall operations of the memory device 100, and controls the write/read circuit 120 to perform a memory operation such as a write operation or a read operation. The control logic 130 controls the power generating unit 140 that generates various voltage signals and/or current signals used in write and read operations. Also, the memory device 100 may include a reference signal generating unit (not shown) that generates various reference signals used in a read operation, and the reference signal generating unit may generate a reference current and/or a reference voltage. A level of the reference current and/or the reference voltage may be adjusted under the control of the control logic 130.

In a write operation performed on the memory device 100, the variable resistance of a memory cell of the memory cell array 110 may be increased or reduced according to written data. For example, each of memory cells of the memory cell array 110 may have a resistance value according to currently stored data, and the resistance value of the memory cell array 110 may be increased or reduced according to data that is to be written to each of the memory cells. A write operation as described above may be classified as a reset write operation and a set write operation. A set state in a resistive memory cell may have a relatively low resistance value, whereas a reset state may have a relatively high resistance value. In a reset write operation a write operation is performed in a direction in which the variable resistance of the resistive memory cell increases, and in a set write operation a write operation is performed in a direction in which the variable resistance of the resistive memory cell is reduced.

The power generating unit 140 generates various power signals in relation to a memory operation. The power generating unit 140 may generate a selection voltage that is provided to a selected word line (selection word line) and a selected bit line (selection bit line) connected to a memory cell selected for a write operation or a read operation. The power generating unit 140 may also generate at least one inhibit voltage that is provided to a word line (non-selected word line) and a bit line (non-selected bit line) connected to a non-selected memory cell.

For example, in a bipolar method, a set voltage Vset may be provided to a bit line connected to a selected (selection) memory cell during a set write operation, and a ground voltage may be provided to a selection word line. Also, a bit line inhibit voltage may be provided to a non-selected bit line, and a word line inhibit voltage may be provided to a non-selected word line. During a reset write operation, a reset voltage Vreset may be provided to a word line connected to a selection memory cell, and a ground voltage may be provided to a selection bit line. Also, a bit line inhibit voltage may be provided to a non-selected bit line, and a word line inhibit voltage may be provided to a non-selected word line. During a read operation, a read voltage Vread and a ground voltage may be respectively provided to a selection bit line (or a selection word line) and a selection word line (or a selection bit line), a bit line inhibit voltage may be provided to a non-selected bit line, and a word line inhibit voltage may be provided to a non-selected word line.

According to an embodiment of the inventive concept, the memory cell array 110 includes at least one dummy word line and/or at least one dummy bit line. Also, the memory cell array 110 includes a dummy cell 111 connected to the dummy word line or the dummy bit line. Data reliability of cells disposed at the edge of the memory cell array 110 may be low due to degradation of characteristics, and the dummy cells to which no data is written may be disposed at the edge of the memory cell array 110 so that data may thereby be stably stored in normal cells.

As described above, in order to electrically separate memory cells to be accessed from unaccessed memory cells, appropriate line biasing is required for non-selected lines and thus various inhibit voltages are applied to non-selected lines. Also, in order to reduce an amount of leakage current that may flow through memory cells connected to the non-selected lines, levels of the various inhibit voltages may be adjusted appropriately.

According to embodiments of the inventive concept, a level of a leakage current flowing through a dummy cell is reduced by variably adjusting a level of a dummy line inhibit voltage applied to at least one dummy line (hereinafter, a dummy line is defined as a concept including at least one of a dummy word line and a dummy bit line). According to embodiments of the inventive concept, by adjusting a level of a dummy line inhibit voltage according to a position of a selection word line or a selection bit line, a level of a leakage current flowing through a dummy cell may be reduced. To this end, the control logic 130 includes an address detector 131, and adjusts a level of a dummy line inhibit voltage based on a result of address detection. According to some embodiments, the power generating unit 140 generates a plurality of inhibit voltages, and one of the plurality of inhibit voltage is selected based on the result of address detection and provided as a dummy line inhibit voltage.

In some embodiments, the memory controller 200 and the memory device 100 are integrated together as a semiconductor device. For example, the memory controller 200 and the memory device 100 may be configured as a memory card. In some embodiments, the memory controller 200 and the memory device 100 are integrated together as a semiconductor device and thus may be configured as a PC card (a PCMCIA card), a compact flash card (CF card), a smart media card (SM/SMC), a memory stick, a multimedia card (MMC, RS-MMC, or MMCmicro, an SD card (SD, miniSD, or microSD), or a universal flash storage (UFS). In other embodiments, the memory controller 200 and the memory device 100 may be integrated together as a semiconductor device and thus may be configured as a Solid State Disk/Drive (SSD).

Figure 2:
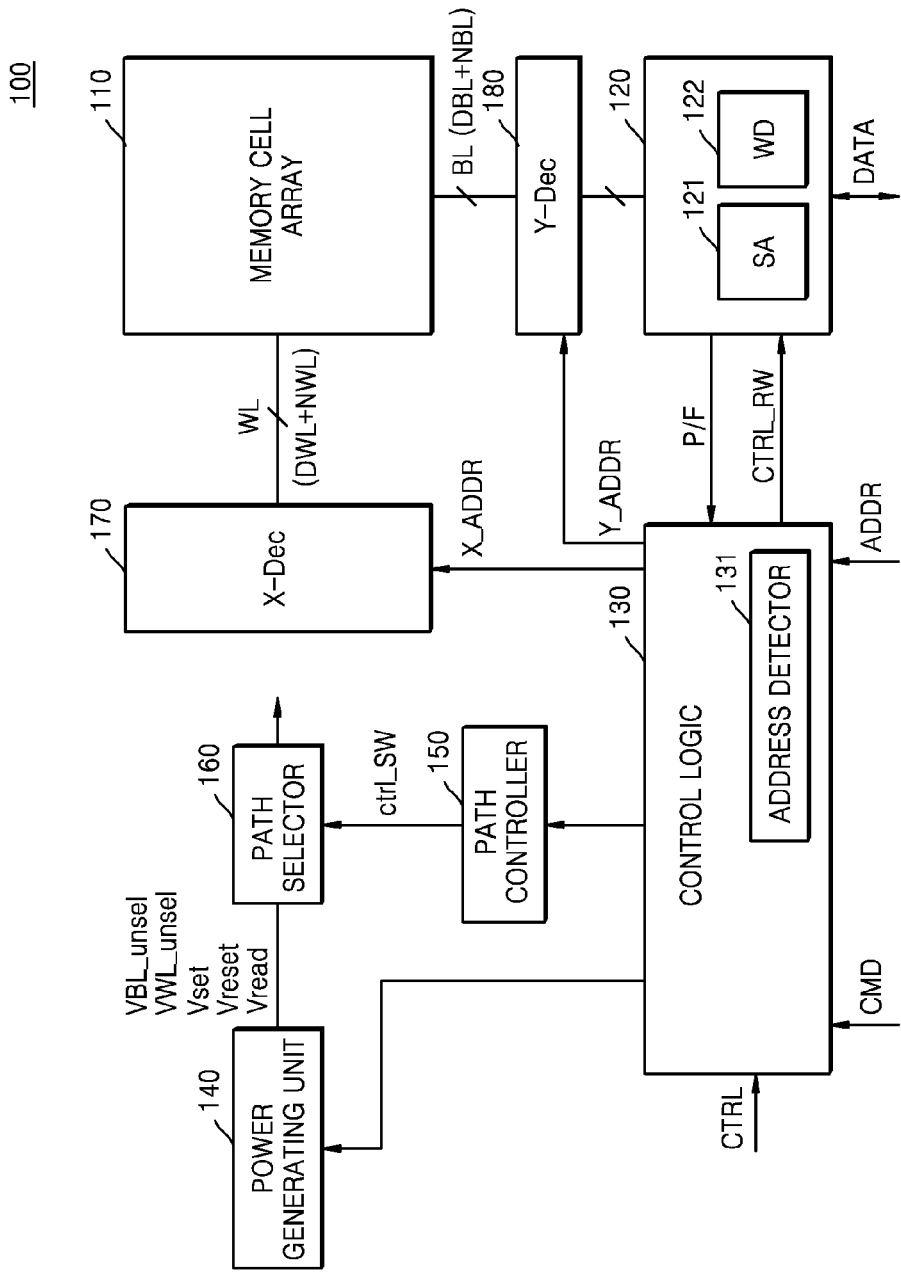
FIG. 2 is a block diagram illustrating the memory device of FIG. 1 according to an embodiment of the inventive concept.

An operation of the memory device 100 included in the memory system 10 that may be configured as described above is described below. FIG. 2 is a block diagram illustrating the memory device 100 of FIG. 1 according to an embodiment of the inventive concept.

Referring to FIG. 2, the memory device 100 includes the memory cell array 110, the write/read circuit 120, the control logic 130, and the power generating unit 140. The memory device 100 further includes a path controller 150, a path selector 160, a row decoder 170, and a column decoder 180.

The write/read circuit 120 includes a sense amplifier 121 and a write driver 122. The control logic 130 includes an address detector 131.

An operation of the memory device 100 illustrated in FIG. 2 according to an embodiment is as follows.

Memory cells included in the memory cell array 110 are connected to a plurality of first signal lines and a plurality of second signal lines. The plurality of first signal lines may be word lines WL, and the plurality of second signal lines may be bit lines BL. The word lines WL may include at least one dummy word line DWL and multiple normal word lines NWL. Also, the bit lines BL may include at least one dummy bit line DBL and multiple normal bit lines NBL. As various voltage signals or current signals are provided via the bit lines BL and the word lines WL, data is written to or read from selected memory cells, and data may be prevented from being written to or read from the remaining non-selected memory cells.

An address ADDR indicating an access-target memory cell and a command CMD both provided from the memory controller 200 (shown in FIG. 1) are received at the control logic 130. The address ADDR includes a row address X_ADDR for selecting a word line of the memory cell array 110 and a column address Y_ADDR for selecting a bit line of the memory cell array 110. The row decoder 170 performs a word line selecting operation in response to the row address X_ADDR, and the column decoder 180 performs a bit line selecting operation in response to the column address Y_ADDR.

The write/read circuit 120 is connected to the bit lines BL and thus may write data DATA provided from memory controller 200 to a selected memory cell, or may read data from a selected memory cell and provide the read data as DATA to memory controller 200. The various power signals generated in the power generating unit 140 are provided to the word lines WL through the row decoder 170 or to the bit lines BL through the write/read circuit 120. Also, the write/read circuit 120 provides a pass/fail signal P/F to the control logic 130 according to a result of reading the read data. The control logic 130 controls a write operation and a read operation of the memory cell array 110 by referring to the pass/fail signal P/F.

The control logic 130 outputs various control signals CTRL_RW for writing data to the memory cell array 110 or reading data from the memory cell array 110, based on a command CMD, an address ADDR, and a control signal CTRL received from the memory controller 200. By doing so, the control logic 130 may control various overall operations in the memory device 100.

The power generating unit 140 generates a set voltage Vset used in a set write operation on memory cells, a set voltage Vreset used in a reset write operation on memory cells, and a read voltage Vread used in a reading operation. Also, the power generating unit 140 generates at least one word line inhibit voltage VWL_unsel provided to non-selected word lines and at least one bit line inhibit voltage VBL_unsel provided to non-selected bit lines.

According to embodiments of the inventive concept, a level of an inhibit voltage provided to a dummy line is adjusted based on a result of detecting an address ADDR indicating a memory cell to be accessed. For example, one of a plurality of word line inhibit voltages VWL_unsel may be provided to a dummy word line DWL based on a result of detecting an address ADDR indicating a memory cell to be accessed. Also, one of a plurality of bit line inhibit voltages VBL_unsel may be provided to a dummy bit line DBL based on a result of detecting an address ADDR indicating a memory cell to be accessed. If two or more dummy word lines DWL are disposed in the memory cell array 110, inhibit voltages of different levels may be provided to the two or more dummy word lines DWL or an inhibit voltage of the same level may be provided to the two or more dummy word lines DWL. Also, if two or more dummy bit lines DBL are disposed in the memory cell array 110, inhibit voltages of different levels may be provided to the two or more dummy bit lines DBL or an inhibit voltage of the same level may be provided to the two or more dummy bit lines DBL.

The path controller 150 and the path selector 160 control transfer paths of word line inhibit voltages VWL_unsel and bit line inhibit voltages VBL_unsel according to a result of detecting an address ADDR. For example, the path selector 160 may receive various power signals from the power generating unit 140 and may include switches (not shown) that switch paths via which the power signals are provided to the word lines WL and the bit lines BL. Power signals respectively provided to the word lines WL may be changed according to a result of switching, and also power signals respectively provided to the bit line BL may be changed. The path controller 150 may receive a result of detecting an address ADDR indicating a memory cell to be accessed and may generate a switch control signal ctrl_SW to control the switches in the path selector 160 in response to the result.

Although levels of the dummy word lines DWL and the dummy bit lines DBL are all changed based on a result of detecting an address ADDR in the embodiment of FIG. 2, the inventive concept is not limited thereto. For example, just a level of an inhibit voltage provided to a dummy word line DWL may be adjusted based on a result of detecting an address ADDR, or just a level of an inhibit voltage provided to a dummy bit line DBL may be adjusted.

Figure 3:
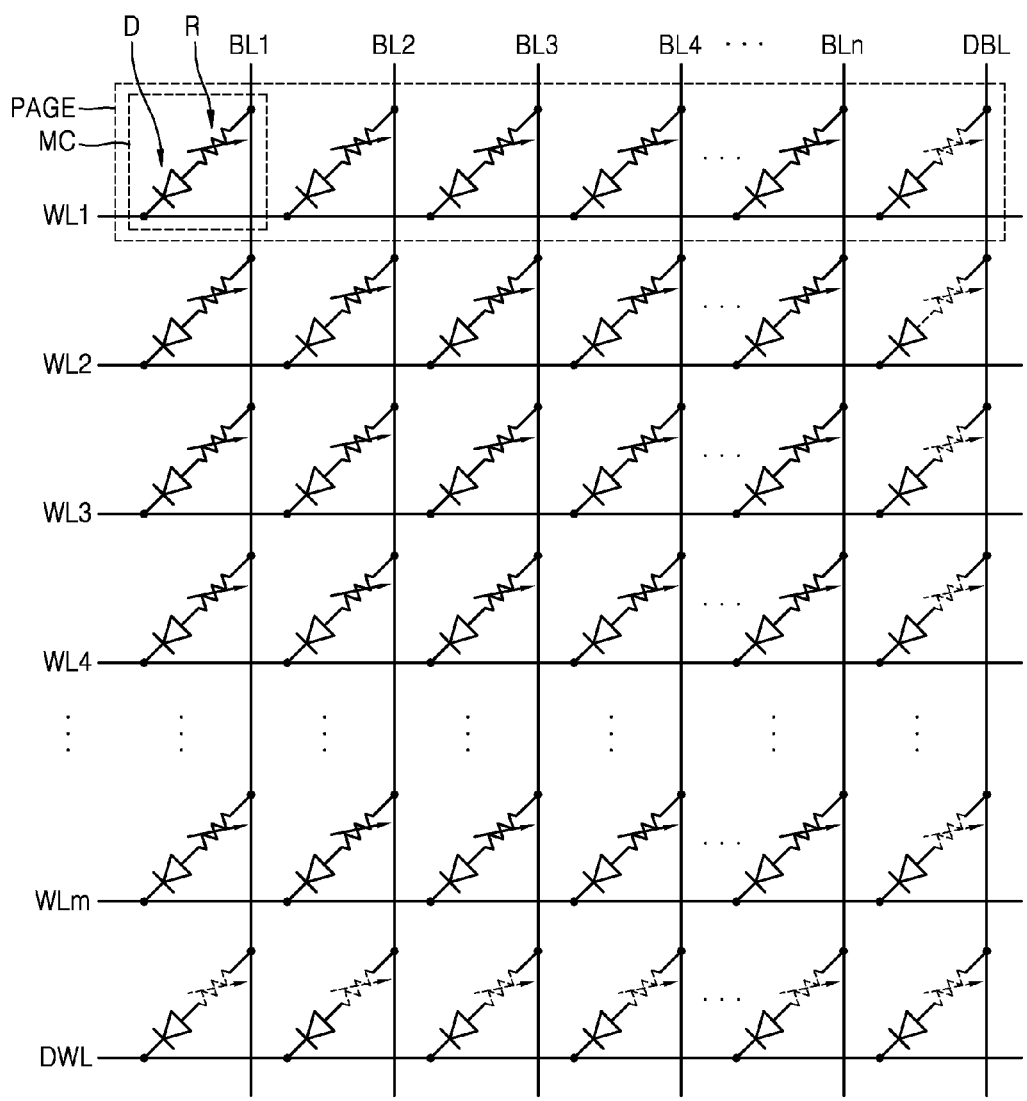
FIG. 3 is a circuit diagram illustrating a memory cell array of FIG. 2 according to an embodiment of the inventive concept.

FIG. 3 is a circuit diagram illustrating the memory cell array 110 of FIG. 2 according to an embodiment of the inventive concept. The memory cell array 110 includes a plurality of cell regions. In FIG. 3 one cell region is illustrated, and the cell region may be a tile for example. In the following description, terms indicating a word line may be defined as a concept including a normal word line and a dummy word line, or a word line may refer to only a normal word line as a contrast concept to a dummy word line. Similarly, terms indicating a bit line may be defined as a concept including a normal bit line and a dummy bit line, or a bit line may refer to only a normal bit line as a contrast concept to a dummy word line.

Referring to FIG. 3, the memory cell array 110 includes a plurality of word lines WL1 through WLm, a plurality of bit lines BL1 through BLn, and a plurality of memory cells MC. Also, the memory cell array 110 further includes a dummy word line DWL and a dummy bit line DBL, although more than one dummy word line DWL and/or more than one dummy bit line may be included. The number of the word lines WL, the number of the bit lines BL, and the number of the memory cells MC may vary according to one or more embodiments. Also, the memory cells MC that are selected by one word line may be defined by a page unit PAGE.

Each of the plurality of memory cells MC includes a variable resistor device R and a selection device D. The variable resistor device R may also be referred to as a variable resistance material, and the selection device D may be referred to as a switching device.

According to embodiments of the inventive concept, the variable resistor device R is connected between one of a plurality of bit lines BL1 through BLn and a selection device D, and the selection device D may be connected between the variable resistor device R and one of a plurality of word lines WL1 through WLm. However, the the inventive concept is not limited thereto, and in other embodiments the selection device D may be connected between one of a plurality of bit lines BL1 through BLn and a variable resistor device R, and the variable resistor device R may be connected between the selection device D and one of a plurality of word lines WL1 through WLm.

In the present embodiment, the variable resistor device R is switched to one of a plurality of resistive states, in response to an electric pulse applied thereto. The variable resistor device R may include a phase-change material having a crystal state that is changed according to a current. The phase-change material may include various materials GaSb, InSb, InSe, or $Sb_2Te_3$ obtained by compounding two elements; GeSbTe, GaSeTe, InSbTe, $SnSb_2Te_4$, or InSbGe obtained by compounding three elements; or AgInSbTe, (GeSn)SbTe, GeSb(SeTe), $Te_{81}Ge_{15}Sb_2S_2$ obtained by compounding four elements.

The phase-change material has an amorphous state that is relatively resistive, and a crystal state that is relatively low-resistive. A phase of the phase-change material may be changed by a Joule of heat that is generated by the current. By using the change of the phase, data may be written.

In other embodiments, the variable resistor device R may not include the phase-change material but may include perovskite compounds, transition metal oxide, magnetic materials, ferromagnetic materials, or antiferromagnetic materials.

The selection device D is connected between one of the word lines WL1 through WLm and a variable resistor device R, and according to a voltage applied to the connected word line and bit line, a current that is supplied to the variable resistor device R may be controlled. In the present embodiment, the selection device D is a PN-junction diode or a PIN-junction diode, and an anode of a diode is connected to the variable resistor device R, and a cathode of the diode is connected to one of the word lines WL1 through WLm. Here, when a voltage difference between the anode and the cathode of the diode is greater than a threshold voltage of the diode, the diode is turned on so that the current is supplied to the variable resistor device R.

Cells connected to a dummy word line DWL and a dummy bit line DBL are dummy cells, to which no data may be written. The variable resistor devices of the dummy cells are shown by dashed lines to indicate that no data may be written to the dummy cells.

Figure 4A:
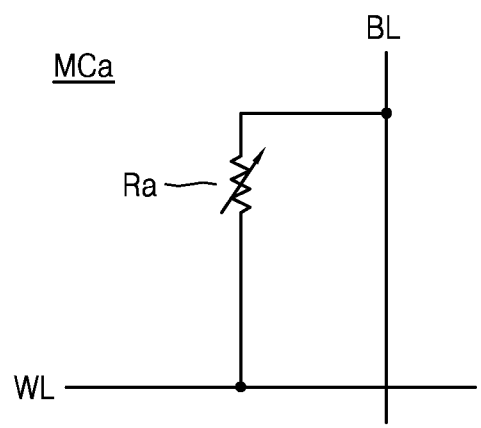
FIGS. 4A, 4B and 4C are circuit diagrams illustrating examples of a memory cell of FIG. 3.
Figure 4B:
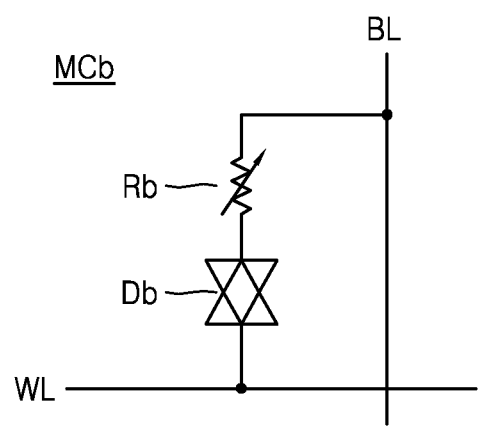
Figure 4C:
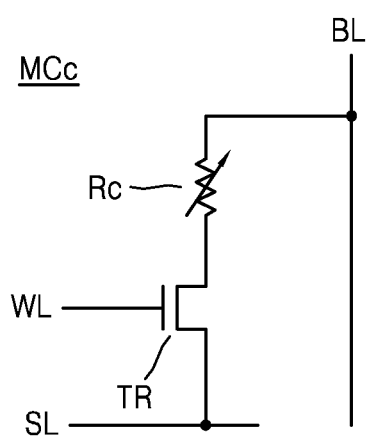

FIGS. 4A, 4B and 4C are circuit diagrams illustrating examples of a memory cell MC of FIG. 3.

Referring to FIG. 4A, a memory cell MCa includes a variable resistor device Ra that is connected between a bit line BL and a word line WL. The memory cell MCa stores data due to voltages that are respectively applied to a bit line BL and a word line WL.

Referring to FIG. 4B, a memory cell MCb includes a variable resistor device Rb and a bidirectional diode Db. The variable resistor device Rb includes a resistive material so as to store data. The bidirectional diode Db is connected between the variable resistor device Rb and a word line WL, and the variable resistor device Rb is connected between a bit line BL and the bidirectional diode Db. In other embodiments, positions of the bidirectional diode Db and the variable resistor device Rb may be changed with respect to each other, so that the bidirectional diode Db is connected between the variable resistor device Rb and a bit line BL, and the variable resistor device Rb is connected between a bit line WL and the bidirectional diode Db. By using the bidirectional diode Db, a leakage current that may flow to a non-selected resistor cell may be blocked.

Referring to FIG. 4C, a memory cell MCc includes a variable resistor device Rc and a transistor TR. The transistor TR is a selection device that supplies or blocks a current to the variable resistor device Rc according to a voltage of the word line WL, that is, a switching device. According to the embodiment of FIG. 4C, in addition to the word line WL, a source line SL that adjusts voltage levels at two ends of the variable resistor device Rc is further included. The transistor TR is connected between the variable resistor device Rc and the source line SL, and the variable resistor device Rc is connected between a bit line BL and the transistor TR. In other embodiments, positions of the transistor TR and the variable resistor device Rc may be changed with respect to each other, so that transistor TR is connected between the variable resistor device Rc and the bit line BL, and the variable resistor device Rc is connected between a source line SL and the transistor TR. The memory cell MCc may be selected or not selected according to an ON or OFF state of the transistor TR that is driven via the word line WL.

Figure 5:
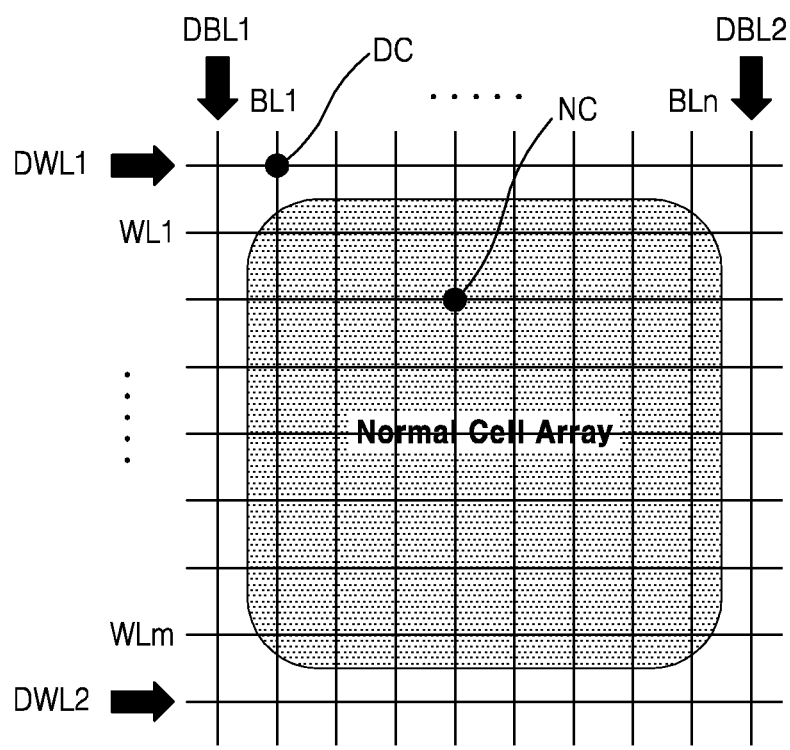
FIG. 5 illustrates a memory cell array including at least one dummy line according to an embodiment of the inventive concept.

FIG. 5 illustrates a memory cell array including at least one dummy line according to an embodiment of the inventive concept. Referring to FIG. 5, dummy lines are disposed at the edge of the memory cell array. For example, first and second dummy word lines DWL1 and DWL2 are disposed at two edges (the top and bottom edges) of the memory cell array, and also first and second dummy bit lines DBL1 and DBL2 of the memory cell array are disposed at two edges (the left and right edges) of the memory cell array. Also, in the following description for convenience of description, a normal word lines are referred to as a word line WL, and normal bit lines are referred to as a bit line BL.

Normal cells NC are disposed in areas where a plurality of word lines WL1 through WLm and a plurality of word lines BL1 through BLn cross each other, and the normal cells NC form a normal cell array. Also, memory cells connected to the first dummy word line DWL1 and memory cells connected to the second dummy word line DWL2 correspond to dummy cells DC. Also, memory cells connected to the first dummy bit line DBL1 and memory cells connected to the second dummy bit line DBL2 correspond to dummy cells DC.

Figure 6:
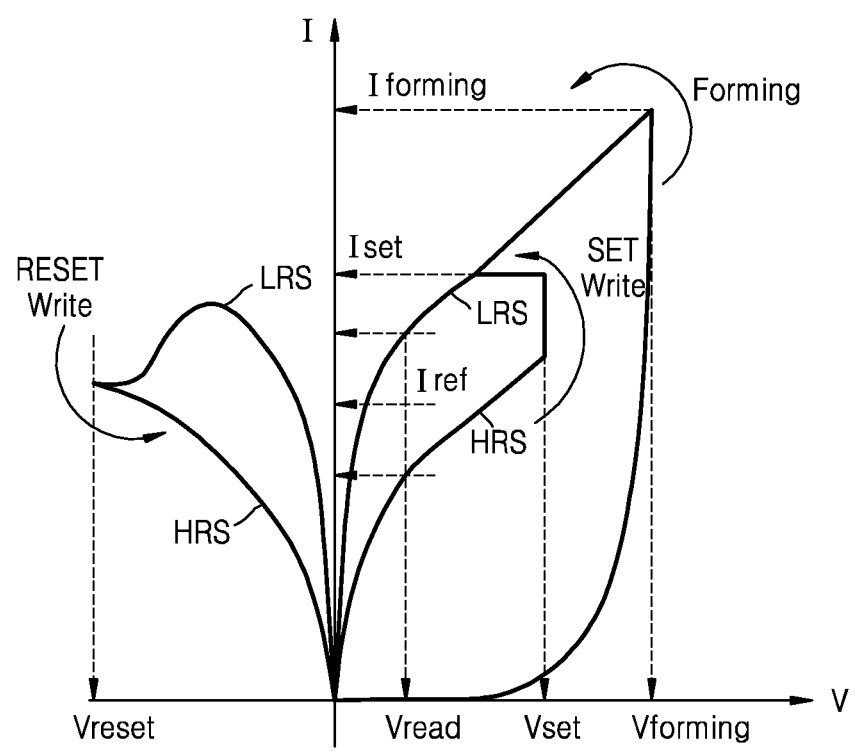
FIG. 6 is a graph showing current-voltage characteristics of a resistive memory cell.

FIG. 6 is a graph showing current-voltage characteristics of a resistive memory cell. The graph of FIG. 6 shows current-voltage characteristics of a memory cell that operates according to a bi-polar method as an example.

As shown in FIG. 6, when a set voltage Vset is applied to a memory cell in a set write operation, as a level of a set current Iset flowing through the memory cell is adjusted, a resistance state of variable resistance of the memory cell may be changed from a high resistive state (HRS) to a low resistive state (LRS). Also, when a reset voltage Vreset is applied to the memory cell in a reset write operation, the resistance state of the variable resistance of the memory cell may be changed from the LRS to the HRS. In addition, in a reading operation, when a predetermined read voltage Vread is applied to the memory cell, a reading current corresponding to the state of the variable resistance of the memory cell is generated. Then, data may be determined by comparing the read current to a reference current Iref.

In addition, when a memory cell is formed through memory cell processes, a forming process may be performed on the memory cell so that the memory cell may normally store the data. The forming process is a process of generating a filament in the memory cell at an initial stage. The filament is a path through which the current in the memory cell flows. The filament is formed by applying high voltage and high current to the memory cell. During the forming process, a forming voltage Vforming that is greater than the set voltage Vset and a forming current Iforming according to the forming voltage Vforming are applied to the memory cell in order to generate the filament.

In the memory cell array of FIG. 5, as a forming process is performed on the normal cells NC included in a normal cell array, data may be normally stored. On the other hand, data is not normally stored in the dummy cells DC, and thus a forming process may not be performed on the dummy cells DC.

Figure 7:
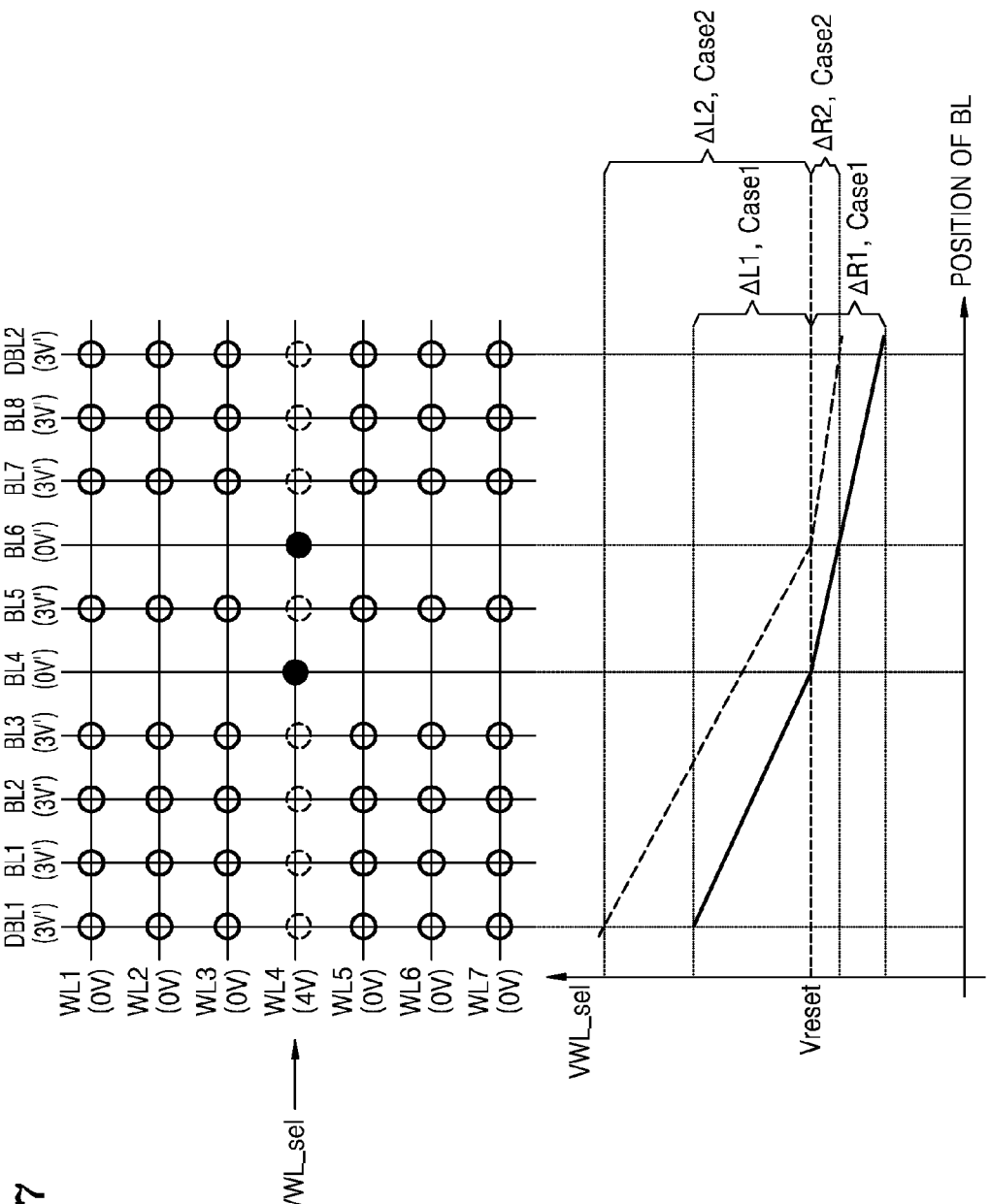
FIG. 7 is a graph showing a leakage current generated in a memory cell array and a change of a word line voltage level according to the leakage current, according to an embodiment of the inventive concept.

FIG. 7 is a graph showing a leakage current generated in a memory cell array and a change of a word line voltage level according to the leakage current, according to an embodiment of the inventive concept. For convenience of description, a drop in a word line voltage of a selection word line caused along a plurality of bit lines is illustrated. However, a bit line voltage may also drop along a plurality of word lines in a similar manner to that illustrated in FIG. 7.

Referring to FIG. 7, the memory cell array of this embodiment includes first through seventh word lines WL1 through WL7, and first through eighth bit lines BL1 through BL8. Also, first and second dummy bit lines DBL1 and DBL2 are respectively disposed on the two sides of the bit lines BL1 through BL8.

Also, FIG. 7 illustrates a reset write operation in which a voltage of a relatively high level is applied to a selection word line (fourth word line WL4 is selected). In this embodiment, 4V is applied to the fourth word line WL4 as a selection word line voltage. On the other hand, the remaining word lines WL1 through WL3 and WL5 through WL7 are non-selected word lines. An inhibit voltage is applied to the non-selected word lines WL1 through WL3 and WL5 through WL7. In this embodiment, an inhibit voltage of 0V is applied as an example. Also, fourth bit line BL4 is selected, and a selection bit line voltage of 0V is applied to the fourth bit line BL4. On the other hand, as the remaining bit lines BL1 through BL3 and BL5 through BL8 correspond to non-selected bit lines, an inhibit voltage of 3V is applied to the non-selected bit lines BL1 through BL3 and BL5 through BL8. In addition, an inhibit voltage of 3V is applied to the first and second dummy bit lines DBL1 and DBL2. It is assumed that the selection word line voltage is applied from the left side of the selected fourth word line WL4 in FIG. 7.

As illustrated in FIG. 7, as a memory operation is performed, a leakage current may be generated in dummy cells and non-selected memory cells. For example, a forward direction leakage current may be generated in memory cells connected to a selection word line according to a biasing condition defined in a reset write operation, and a reverse leakage current may be generated in memory cells connected to non-selected word lines.

In a resistive memory device which operates based on a current, a voltage drop (IR drop) may be caused along a selection line, and voltage drop characteristics may vary according to a position of the selection line. For example, a selection word line is disposed to cross a plurality of bit lines and a dummy bit line, and the plurality of bit lines and the dummy bit line are affected by the voltage drop caused along the selection word line. Also, according to a position of a selection bit line among the plurality of bit lines, an amount of influence on the plurality of bit lines and the dummy bit line varies due to the voltage drop of the selection word line.

According to an embodiment of the inventive concept, a level of an inhibit voltage applied to at least one dummy bit line is controlled to be varied based on a result of detecting a position of a selection line (e.g., a selection bit line). In addition, a level of an inhibit voltage applied to non-selected bit lines may also be varied.

Referring to FIG. 7, voltage drop characteristics generated in a selection word line vary according to a position of a selection bit line. When an example in which a fourth bit line BL4 is selected is defined as Case 1, and an example in which a sixth bit line BL6 is selected is defined as Case 2, selection word line voltages having different levels may be applied respectively to the cases in order to provide a memory cell to be accessed (e.g., a selection cell), with a constant level of voltage (e.g., a reset voltage). Referring to FIG. 7, as a relatively high current flows to non-selected memory cells located on the left of a selection memory cell, a relatively large voltage drop is generated along the selection word line to the left of the selection memory cell. On the other hand, as a relatively low current flows to non-selected memory cells located on the right side of the selected memory cell, a relatively small voltage drop is generated along the selection word line to the right of the selection memory cell. Accordingly, a relatively low level of voltage is applied to a word line of a dummy cell connected to a first dummy bit line DBL1 located on the left in Case 1 compared to Case 2, and also a selection voltage of a relatively low level may be applied to a word line of a dummy cell connected to a second dummy bit line DBL2 located on the right side in Case 1 compared to Case 2.

That is, in Case 1, a level difference ΔL1 between a voltage of a selection word line crossing the first dummy bit line DBL1 and a reset voltage Vreset is different from a level difference ΔL2 in Case 2. Also, in Case 1, a level difference ΔR1 between a voltage of a selection word line crossing the second dummy bit line DBL2 and a reset voltage Vreset is different from a level difference ΔR2 in Case 2. Accordingly, in order to reduce a leakage current generated in a dummy cell, a level difference between a word line voltage and a bit line voltage applied to two ends of the dummy cell is to be reduced, and according to an embodiment of the inventive concept, a level of an inhibit voltage applied to the first and second dummy bit lines DBL1 and DBL2 is adjusted based on a result of detecting an address indicating a memory cell to be accessed.

Figure 8:
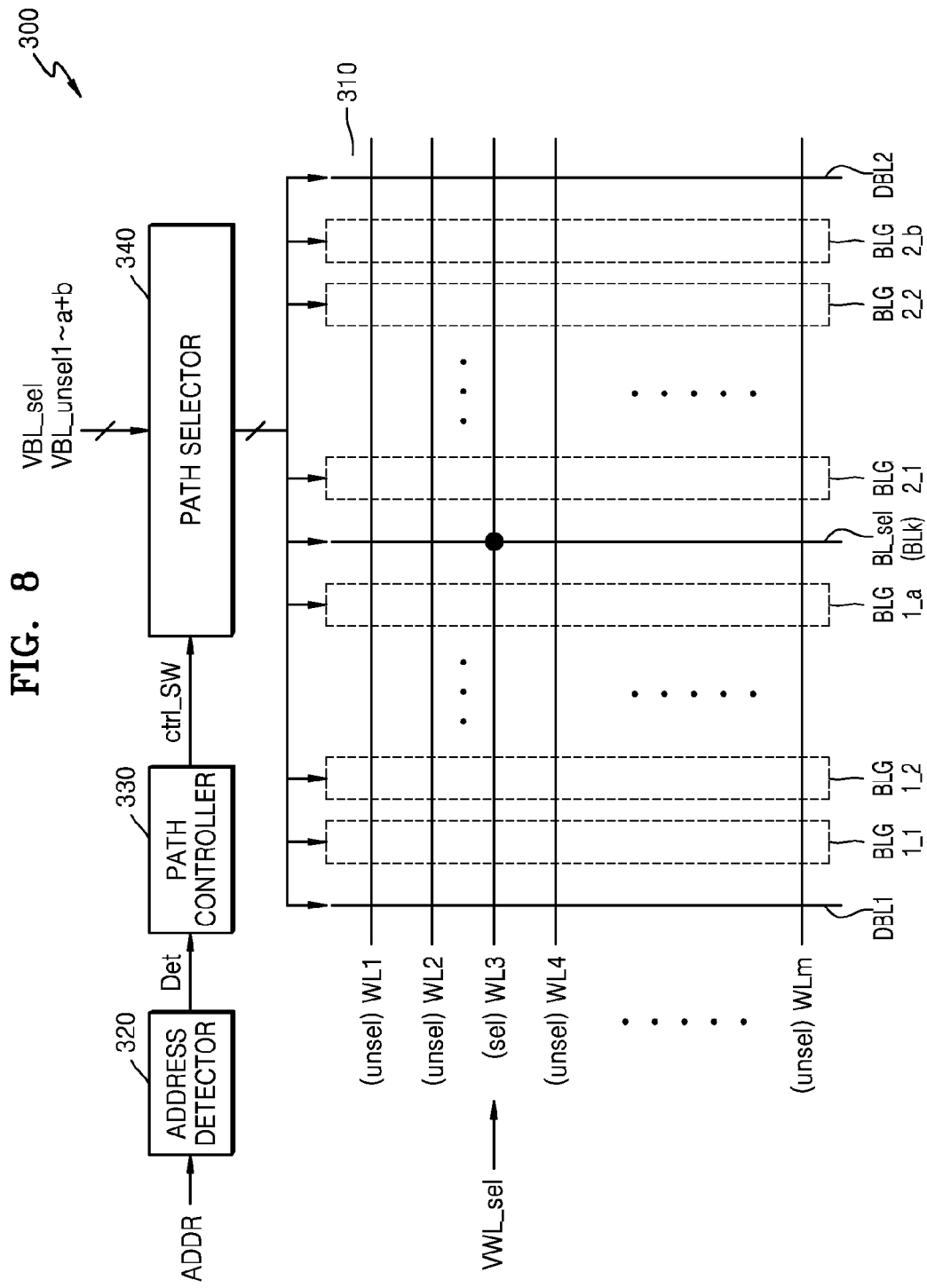
FIG. 8 is a block diagram illustrating an operation of adjusting a level of an inhibit voltage applied to a dummy line, according to an embodiment of the inventive concept.

FIG. 8 is a block diagram illustrating an operation of adjusting a level of an inhibit voltage applied to a dummy line, according to an embodiment of the inventive concept. As illustrated in FIG. 8, a memory device 300 includes a memory cell array 310, an address detector 320, a path controller 330, and a path selector 340. Also, the memory cell array 310 includes a plurality of word lines, for example m word lines WL1 through WLm. Also, the memory cell array 310 includes a plurality of bit lines, for example as a selection bit line a k-th bit line BLk, and as non-selected bit lines a plurality of groups of bit lines BLG1_1 to BLG1_a and BLG2_1 to BLG2_b, and first and second dummy bit lines DBL1 and DBL2. In the embodiment of FIG. 8, it is assumed that a third word line WL3 is selected. Also, it is assumed that a selection word line voltage VWL_sel is applied to the left side of the third word line WL3 in FIG. 8.

As the third word line WL3 is selected, a selection word line voltage VWL_sel is applied to the third word line WL3, and on the other hand an inhibit voltage is applied to the remaining word lines. Also, when a k-th bit line BLk is selected, a selection bit line voltage is applied to the k-th bit line BLk, and on the other hand an inhibit voltage is applied to the remaining bit lines and the first and second bit lines DBL1 and DBL2.

When applying an inhibit voltage, the non-selected bit lines may be divided into a plurality of bit line groups. For example, with respect to the k-th bit line BLk, a bit line groups BLG1_1 to BLG1_$a$ are located on the left side, and b bit line groups BLG2_1 to BLG2_$b$ are located on the right side. The power generating unit included in the memory device 300 generates a selection bit line voltage VBL_sel and a plurality of bit line inhibit voltages (e.g., (a+b)), for example bit line inhibit voltages VBL_unsel1~$a+b$. According to a switching connection state of switches included in the path selector 340, the bit line inhibit voltages VBL_unsel1~$a+b$ are provided to the bit line groups BLG1_1 to BLG1_$a$ and BLG2_1 to BLG2_$b$. For example, different bit lines groups receive different levels of inhibit voltages.

An operation of the memory device 300 of FIG. 8 according to an embodiment will be described below with reference to the graph shown in FIG. 7. A bit line group (e.g., bit line groups BLG1_1 and BLG2_$b$) located relatively far from the selected bit line BLk receive a relatively high level of inhibit voltage compared to other bit line groups. Also, the first and second dummy bit lines DBL1 and DBL2 are also relatively far from the selection bit line BLk, and thus a relatively high level of inhibit voltage is provided to the first and second dummy bit lines DBL1 and DBL2. According to an embodiment, the first dummy bit line DBL1 may receive the same inhibit voltage as the inhibit voltage provided to the bit line group BLG1_1. Also, the second dummy bit line DBL2 may receive the same inhibit voltage as the inhibit voltage provided to the bit line group BLG2_$b$.

Also, an inhibit voltage provided to the first and second dummy bit lines DBL1 and DBL2 may be varied according to distance between a position where the selection word line voltage VWL_sel is applied and the selection bit line BL_sel. For example, as illustrated in FIG. 7, a level of an inhibit voltage provided to the first and second dummy bit lines DBL1 and DBL2 may be adjusted to be low when the distance between the position where the selection word line voltage VWL_sel is applied and the selection bit line BL_sel is short. On the other hand, a level of an inhibit voltage provided to the first and second dummy bit lines DBL1 and DBL2 may be adjusted to be high when the distance between the position where the selection word line voltage VWL_sel is applied and the selection bit line BL_sel is long.

Meanwhile, when applying a non-selected voltage to the first and second dummy bit lines DBL1 and DBL2, one of the plurality of inhibit voltages VBL_unsel1~$a+b$ generated in a power generating unit (not shown) is selected and applied. For example, the plurality of inhibit voltages VBL_unsel1~$a+b$ have different levels from one another, and a position of a selection bit line is detected based on a result of detecting an address ADDR indicating a memory cell to be accessed, and inhibit voltages having different levels are applied to the first and second dummy bit lines DBL1 and DBL2 based on the result of detecting.

To this end, the address detector 320 generates a result signal Det indicating a result of detecting an address ADDR indicating a memory cell to be accessed and provides the path controller 330 with the result signal Det. The path controller 330 generates a plurality of switch control signals ctrl_SW in response to the result signal Det and provides the switch control signals ctrl_SW to the path selector 340. The path selector 340 receives the selection bit line voltage VBL_sel and the bit line inhibit voltages VBL_unsel1~$a+b$ and performs a switching operation in response to a switch control signal ctrl_SW so that a path is selected, via which the selection bit line voltage VBL_sel and the bit line inhibit voltages VBL_unsel1~$a+b$ are provided to a plurality of bit lines (including dummy bit lines).

An example of adjusting an inhibit voltage provided to a dummy line will be described below with reference to FIG. 9.

For example, when it is assumed that a selection word line voltage is provided from a position where the first dummy bit line DBL1 is disposed (left side of the drawing), if a bit line on the left side of memory cell array 310 is selected so that the selected bit line is close to the first dummy bit line DBL1 (or if a distance between a position where a selection word line voltage is applied and a position of a selection bit line is short), a relatively low level of inhibit voltage is applied to the first and second dummy bit lines DBL1 and DBL2. On the other hand, if a bit line on the right side of memory cell array 310 is selected so that the selected bit line is far from the first dummy bit line DBL1 (or if a distance between a position where a selection word line voltage is applied and a position of a selection bit line is long), a relatively high level of inhibit voltage may be applied to the first and second dummy bit lines DBL1 and DBL2.

FIG. 9 is a table showing examples of adjusting an inhibit voltage provided to a dummy line. The table of FIG. 9 corresponds to an embodiment in which a selection word line voltage is provided from a position where the first dummy bit line DBL1 is disposed (the left side of the drawing). On the other hand, if a selection word line voltage is provided from a position where the second dummy bit line DBL2 is disposed (the right side of the drawing), the levels of the inhibit voltage may be adjusted to be opposite to the levels shown in the table of FIG. 9. That is, in the case that a selection word line voltage is provided from a position where the second dummy bit line DBL2 is disposed, if a bit line located on the left side is selected (or if a bit line far from a position where a selection word line voltage is applied), an inhibit voltage of a relatively high level may be applied to the first and second dummy bit lines DBL1 and DBL2.

Referring to FIG. 8 again, bit lines groups included in the memory cell array 310 may be differently set according to a position of a selection bit line. For example, when the position of the selection bit line is moved to the left, the number of bit line groups located on the left side of the selection bit line may be reduced, and the number of bit line groups located on the right side of the selection bit line may increase. In contrast, when the position of the selection bit line is moved to the right, the number of bit line groups located on the left side of the selection bit line may increase, and the number of bit line groups located on the right side of the selection bit line may be reduced.

As FIG. 8 illustrates an embodiment in which the number of inhibit voltages and the number of bit line groups BLG1_1 to BLG1_$a$ and BLG2_1 to BLG2_$b$ are identical, inhibit voltages VBL_unsel1~$a+b$ having all different levels are thus applied to the bit line groups BLG1_1 to BLG1_$a$ and BLG2_1 to BLG2_$b$. However, the inventive concept is not limited thereto. In other embodiments, at least some of the bit line groups BLG1_1 to BLG1_$a$ and BLG2_1 to BLG2_$b$ may be set to receive an inhibit voltage of the same level, and accordingly in this case inhibit voltages less than the number of the bit line groups may be generated.

Figure 10:
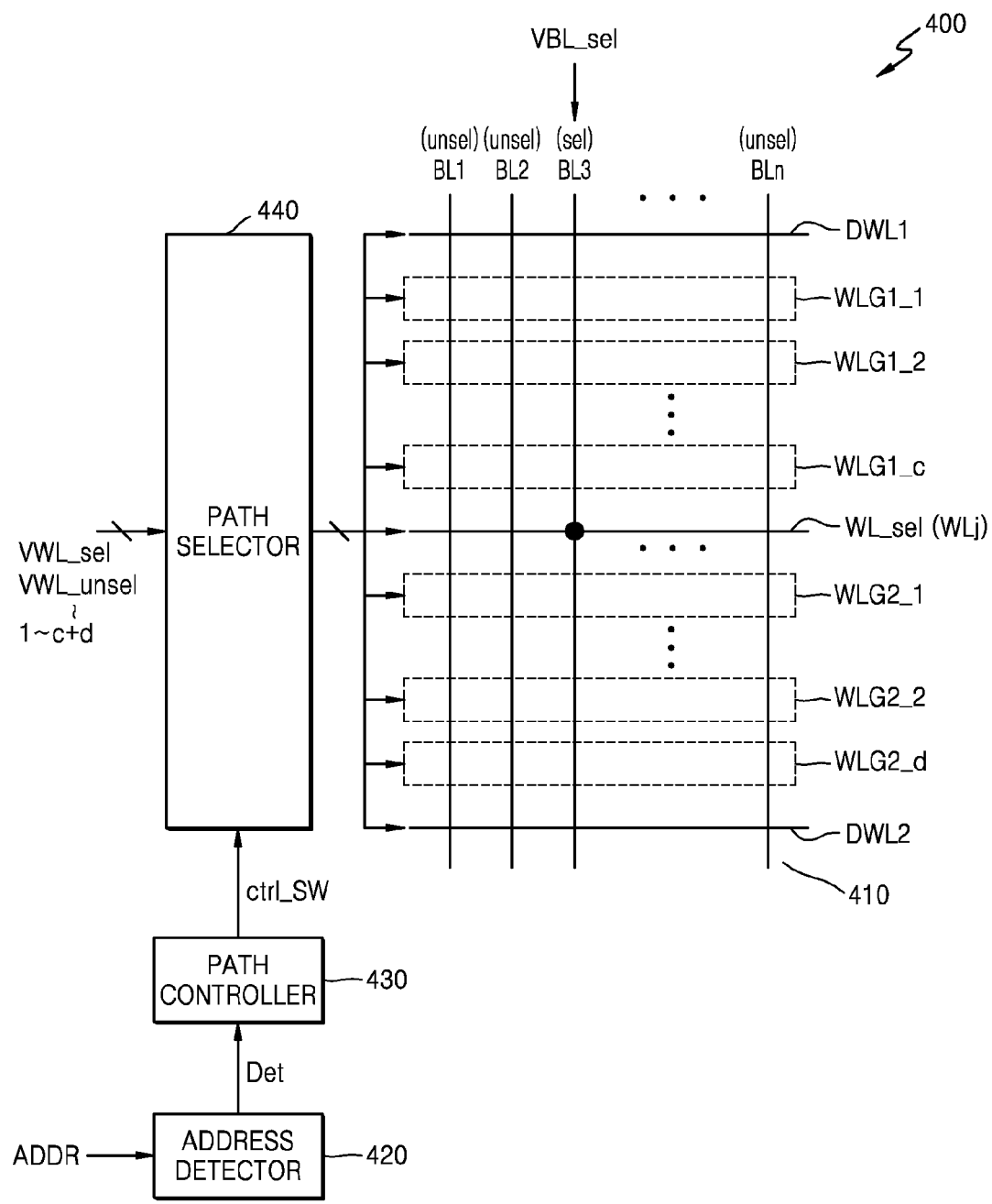
FIG. 10 is a block diagram illustrating an example of adjusting a level of an inhibit voltage applied to a dummy line, according to another embodiment of the inventive concept.

FIG. 10 is a block diagram illustrating an example of adjusting an inhibit voltage applied to a dummy line, according to another embodiment. FIG. 10 illustrates an embodiment in which an inhibit voltage is applied to a dummy word line. As illustrated in FIG. 10, a memory device 400 includes a memory cell array 410, an address detector 420, a path controller 430, and a path selector 440. Also, the memory cell array 410 includes a plurality of n bit lines BL1 through BLn. Also, the memory cell array 410 includes a plurality of word lines including a jth word line WLj as a selection word line, a plurality of groups of word lines WLG1_1 to WLG1_c and WLG2_1 to WLG2_d as non-selected word lines, and first and second dummy word lines DWL1 and DWL2. In the embodiment of FIG. 10, it is assumed that a third bit line BL3 is selected. Also, in the embodiment of FIG. 10, it is assumed that a selection bit line voltage VBL_sel is applied from a top part in the drawing (e.g., a position where a first dummy word line is disposed).

Similarly to the embodiment illustrated in FIG. 8, the address detector 420 generates a result signal Det indicating a result of detecting an address ADDR indicating a memory cell to be accessed, and provides the result signal Det to the path controller 430. The path controller 430 generates a plurality of switch control signals ctrl_SW in response to the result signal Det and provides to the path selector 440 the switch control signals ctrl_SW. The path selector 340 performs a switching operation in response to the switch control signals ctrl_SW, provides a selection word line voltage VWL_sel to a selection word line WLj, and provides word line inhibit voltages VWL_unsel1~c+d to the word line groups WLG1_1 to WLG1_c and WLG2_1 to WLG2_d and the first and second dummy word lines DWL1 and DWL2.

In the same or similar manner as the above-described embodiment, an inhibit voltage selected from among the word line inhibit voltages VWL_unsel1~c+d is provided to each of the first and second dummy word lines DWL1 and DWL2. According to an embodiment, inhibit voltages having different levels are respectively provided to the first and second dummy word lines DWL1 and DWL2 based on a result of detecting an address ADDR indicating a memory cell to be accessed. When the selection word line WLj is moved to an upper position on the memory cell array 410 according to a result of detecting an address ADDR, an inhibit voltage of a relatively low level is provided to the first and second dummy word lines DWL1 and DWL2, whereas when the selection word line WLj is moved to a lower position on the memory cell array 410 according to a result of detecting an address ADDR indicating a memory cell to be accessed, a relatively high level of inhibit voltage may be provided to the first and second dummy word lines DWL1 and DWL2.

However, the above-described embodiment is exemplary, and the embodiments of the inventive concept may be modified in various manners. For example, when the selection word line WLj is moved to an upper position according to a memory operation, an inhibit voltage of a relatively high level is provided to the first and second dummy word lines DWL1 and DWL2, and when the selection word line WLj is moved to a lower position, an inhibit voltage of a relatively low level is provided to the first and second dummy word lines DWL1 and DWL2. In case that a selection bit line voltage VBL_sel is applied from a bottom part in the drawing (e.g., a position where a second dummy word line is disposed), an inhibit voltage of a relatively high level may be provided to the first and second dummy word lines DWL1 and DWL2, when the selection word line WLj is moved to an upper position.

Also, according to other embodiments, in FIG. 10 the first dummy word line DWL1 is adjacent to a first word line group WLG1_1 in an upper portion of the memory cell array 410, and the second dummy word line DWL2 is adjacent to a dth word line group WLG2_d in a lower portion of the memory cell array 410, and thus the same inhibit voltage may be applied to the first dummy word line DWL1 and the first word line group WLG1_1. Also, the same inhibit voltage may be applied to the second dummy word line DWL2 and the dth word line group WLG2_d.

Figure 11:
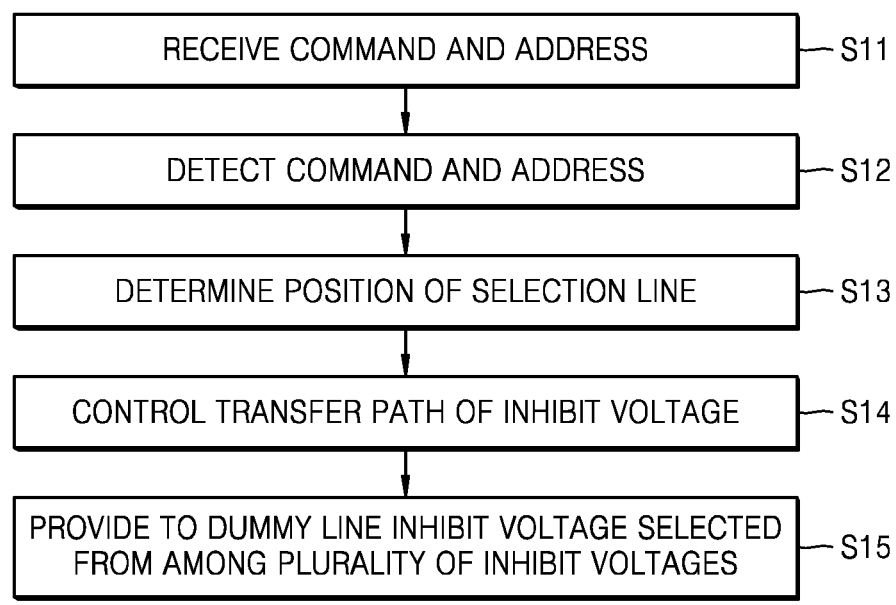
FIG. 11 is a flowchart illustrating a method of operating a resistive memory device, according to an embodiment of the inventive concept.

FIG. 11 is a flowchart illustrating a method of operating a resistive memory device such as shown in FIGS. 1 and 2, according to an embodiment of the inventive concept.

As illustrated in FIG. 11, the resistive memory device receives a command and an address in operation S11, and performs a memory operation corresponding to the command. The resistive memory device performs a detecting operation on the command and the address in operation S12, and determines which memory operation among a set write operation, a reset write operation, and a reading operation is to be performed based on a detection result. The resistive memory device then determines in operation S13 a position of a selection line (e.g., a selection word line and a selection bit line) based on a result of detecting an address.

As a memory operation is performed, a selection voltage is applied to a selection line, and an inhibit voltage is provided to a plurality of non-selected lines. The resistive memory device generates a plurality of inhibit voltages to be provided to the plurality of non-selected lines. According to embodiments of the inventive concept, a memory cell array included in the resistive memory device includes at least one dummy line (e.g., a dummy word line and a dummy bit line), and an inhibit voltage to be provided to the dummy line is determined based on a result of determining a selection line. Accordingly, in operation S14 a transfer path, via which an inhibit voltage is provided to non-selected lines and the at least one dummy line, is controlled based on a result of detecting an address.

By controlling the transfer path, various inhibit voltages are provided to the non-selected lines and the dummy line, and a selected inhibit voltage from among a plurality of inhibit voltages may be provided to the dummy line in operation S15. That is, an inhibit voltage that is to be provided to a dummy line may be varied from among a plurality of inhibit voltages based on a result of detecting an address.

When selecting an inhibit voltage to be applied to a dummy line according to an embodiment of the inventive concept, a result of detecting a command may be further used. That is, a memory operation to be performed may be determined based on a result of detecting a command, and inhibit voltages of different levels may be provided to various non-selected lines and a dummy line according to the memory operation. Thus, an operation of selecting an inhibit voltage to be provided to the dummy line may further use a result of detecting a command.

Figure 12:
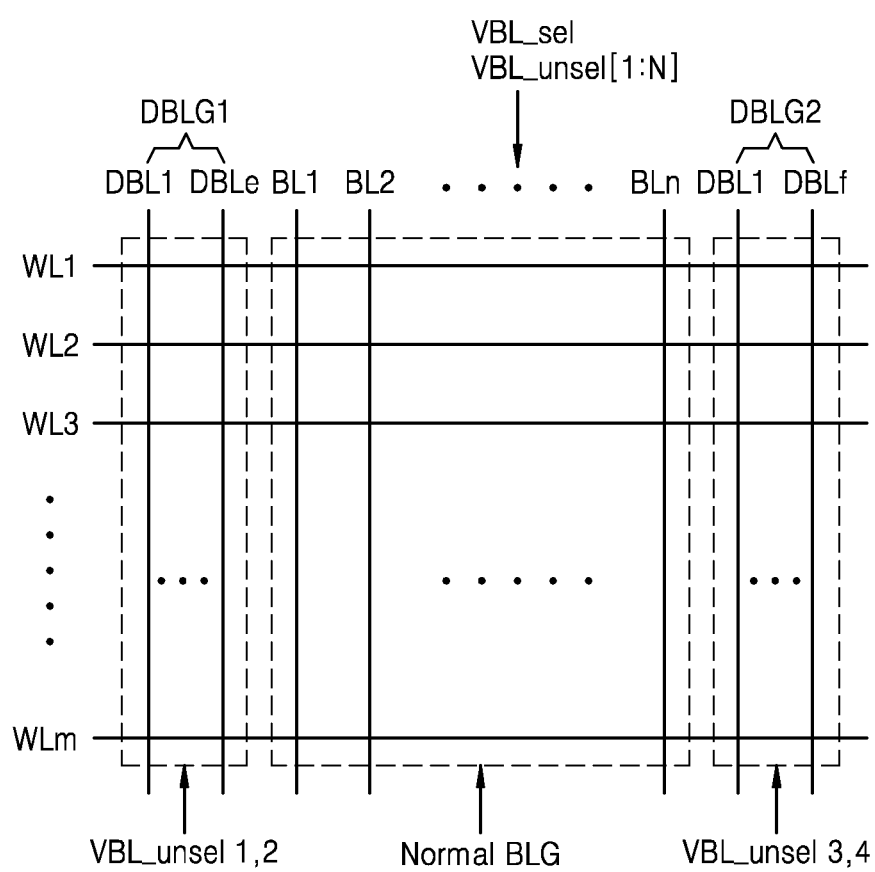
FIG. 12 illustrates a memory device according to another embodiment of the inventive concept.

FIG. 12 illustrates a memory device according to another embodiment of the inventive concept. Referring to FIG. 12, a plurality of dummy bit lines are disposed at a side of a memory cell array. While not illustrated in FIG. 12, when a plurality of dummy word lines are disposed at a side of the memory cell array, the memory device may operate in the same or similar manner as illustrated in FIG. 12.

As illustrated in FIG. 12, the memory cell array includes m word lines WL1 through WLm and n bit lines BL1 through BLn. The n bit lines BL1 through BLn configure a normal bit line group normal BLG. Also, a first dummy bit line group DBLG1 is disposed at a side (left side) of the bit lines BL1 through BLn, and also a second dummy bit line group DBLG2 is disposed at the other side (right side) of the bit lines BL1 through BLn. The first dummy bit line group DBLG1 includes (e) dummy bit lines DBL1 through DBLe, and the second dummy bit line group DBLG2 includes (f) dummy bit lines DBL1 through DBLf.

As a memory operation is performed, a selection bit line voltage VBL_sel is applied to one or more of the bit lines from among the bit lines BL1 through BLn, whereas a plurality of bit line inhibit voltages VBL_unsel[1:N] is applied to the remaining bit lines. Also, inhibit voltages respectively provided to the first and second dummy bit line groups DBLG1 and DBLG2 are selected based on a result of detecting an address indicating memory cells to be accessed. For example, based on a result of detecting an address, two or more inhibit voltages selected from among N bit line inhibit voltages VBL_unsel[1:N] may be selected and provided to the first dummy bit line group DBLG1, and also two or more inhibit voltages selected from among N bit line inhibit voltages VBL_unsel[1:N] may be selected and provided to the second dummy bit line group DBLG2.

According to the embodiment of FIG. 12, first and second inhibit voltages VBL_unsel1,2 are provided to the first dummy bit line group DBLG1, and third and fourth inhibit voltages VBL_unsel3,4 are provided to the second dummy line group DBLG2, and if a position of a selection bit line is changed, inhibit voltages respectively provided to the first and second dummy bit line groups DBLG1 and DBLG2 according to the above-described embodiment may be changed.

Figure 13:
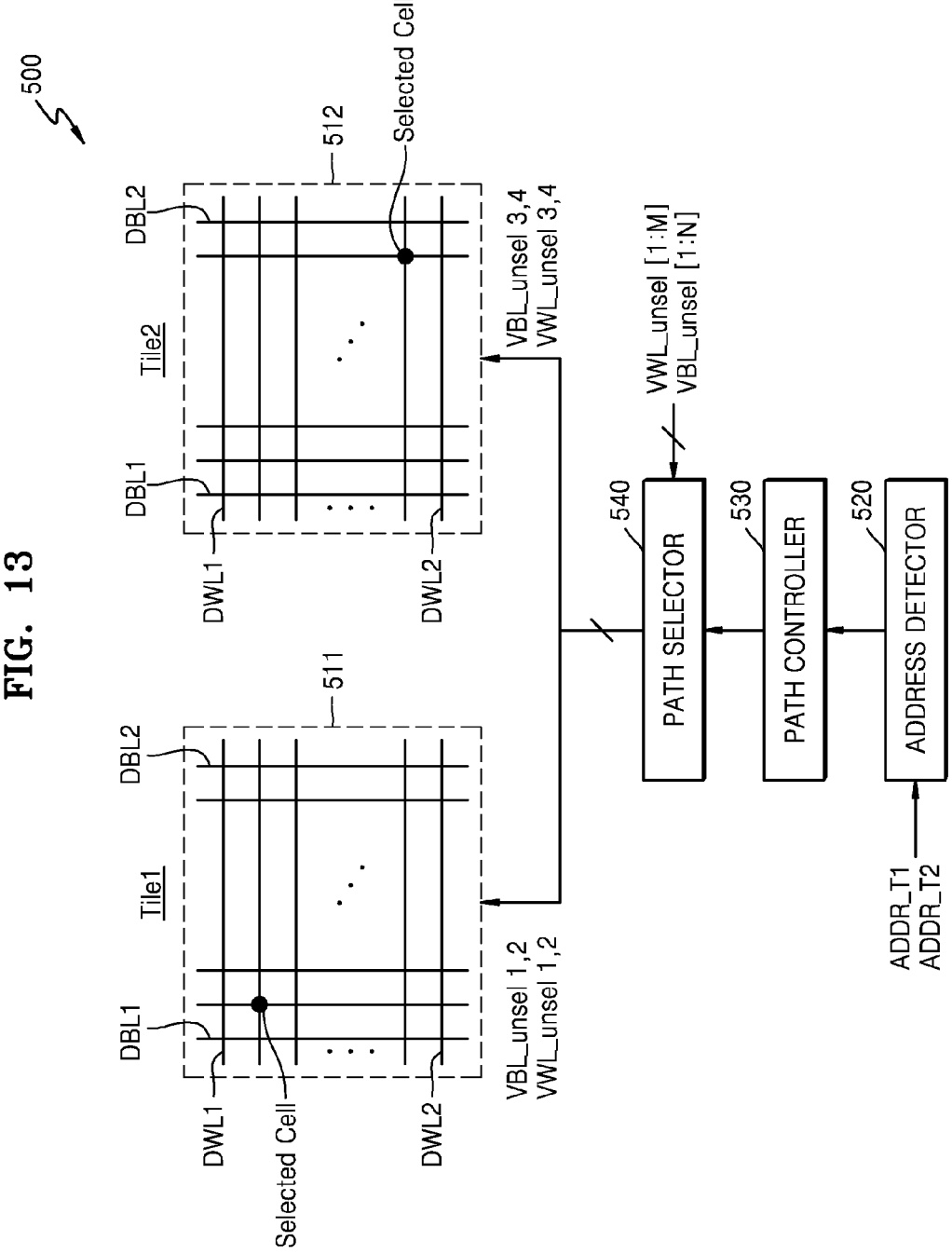
FIG. 13 illustrates a memory device according to another embodiment of the inventive concept.

FIG. 13 illustrates a memory device according to another embodiment of the inventive concept. According to the embodiment of FIG. 13, different inhibit voltages are provided to respective tiles.

As illustrated in FIG. 13, a memory device 500 includes multiple tiles, for example a first tile Tile1 511 and a second tile Tile2 512. Each of the first and second tiles 511 and 512 include a plurality of word lines and a plurality of bit lines, and also first and second dummy word lines DWL1 and DWL2 and first and second dummy bit lines DBL1 and DBL2.

When performing a memory operation, memory cells of the first and second tiles 511 and 512 may be simultaneously accessed. Also, when memory cells of the first and second tiles 511 and 512 are accessed, memory cells of the first tile 511 and memory cells of the second tile 512 that are at different positions from those of the first tile 511 may be accessed. Accordingly, inhibit voltages of different levels may be provided to dummy lines of the first tile 511 and the second tile 512.

An address detector 520 receives an address ADDR_T1 with respect to the first tile 511 and an address ADDR_T2 with respect to the second tile 512, and provides a detection result to a path controller 530. The path controller 530 generates a plurality of switch control signals based on the detection result and provides the switch control signals to the path selector 540. The path selector 540 performs a switching operation in response to the switch control signals and selects a transfer path of various voltages. FIG. 13 illustrates an embodiment in which paths of inhibit voltages are selected, and accordingly the path selector 540 selects transfer paths of a plurality of word line inhibit voltages VWL_unsel[1:1M] and a plurality of bit line inhibit voltages VBL_unsel[1:N].

For example, a first word line inhibit voltage VWL_unsel1 may be provided to a first dummy word line DWL1 of the first tile 511, and a second word line inhibit voltage VWL_unsel2 may be provided to a second dummy word line DWL2 of the first tile 511. Also, a first bit line inhibit voltage VBL_unsel1 may be provided to the first dummy bit line DBL1 of the first tile 511, and a second bit line inhibit voltage VBL_unsel2 may be provided to the second dummy bit line DBL2 of the first tile 511.

A third word line inhibit voltage VWL_unsel3 may be provided to the first dummy word line DWL1 of the second tile 512, and a fourth word line inhibit voltage VWL_unsel4 may be provided to the second dummy word line DWL2 of the second tile 512. Also, a third bit line inhibit voltage VBL_unsel3 may be provided to the first dummy bit line DBL1 of the second tile 512, and a fourth bit line inhibit voltage VBL_unsel4 may be provided to the second dummy bit line DBL2 of the second tile 512.

Later, if positions of memory cells selected in the first and second tiles 511 and 512 are changed, levels of inhibit voltages provided to dummy lines of the first and second tiles 511 and 512 may be changed.

Figure 14:
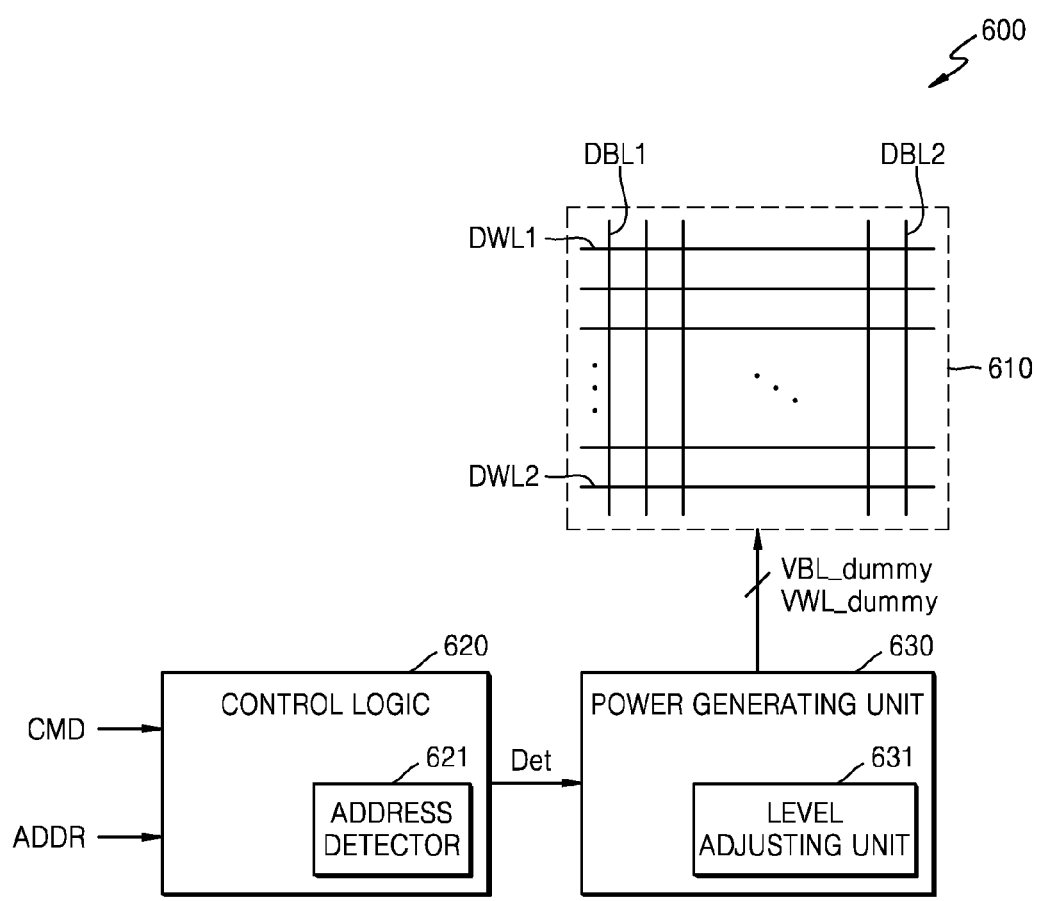
FIG. 14 illustrates a memory device according to another embodiment of the inventive concept.

FIG. 14 illustrates a memory device 600 according to another embodiment of the inventive concept. According to the embodiment of FIG. 14, a dummy line voltage with respect to a dummy line is additionally generated.

As illustrated in FIG. 14, the memory device 600 includes a memory cell array 610, a control logic 620, and a power generating unit 630. The control logic 620 includes an address detector 621, and the power generating unit 630 includes a level adjusting unit 631. The memory cell array 610 includes as at least one dummy bit line first and second dummy bit lines DBL1 and DBL2, and also as at least one dummy word line first and second dummy word lines DWL1 and DWL2. The control logic 620 controls the memory device 600 such that a memory operation is performed in response to a command CMD, and as the address detector 621 detects an address ADDR, a position of a selection line (e.g., a selection word line or a selection bit line) is determined.

As the position of the selection line is changed, levels of inhibit voltages provided to the first and second dummy bit lines DBL1 and DBL2 and the first and second dummy word lines DWL1 and DWL2 are changed. Accordingly, a result signal Det indicating a result of detecting an address ADDR is provided to the power generating unit 630, and the level adjusting unit 631 performs an operation of adjusting levels of inhibit voltages. Accordingly, at least one dummy word line inhibit voltage VWL_dummy and at least one dummy bit line inhibit voltage VBL_dummy, each of which having a level adjusted according to the changed position of the selection line, are generated and provided to the memory cell array 610.

According to the above-described embodiment of the inventive concept, a level of an inhibit voltage applied to a dummy line is adjusted in consideration of a voltage drop of a selection line, and thus a leakage current flowing through a dummy cell may be reduced and a stable memory operation may be performed.

Figure 15:
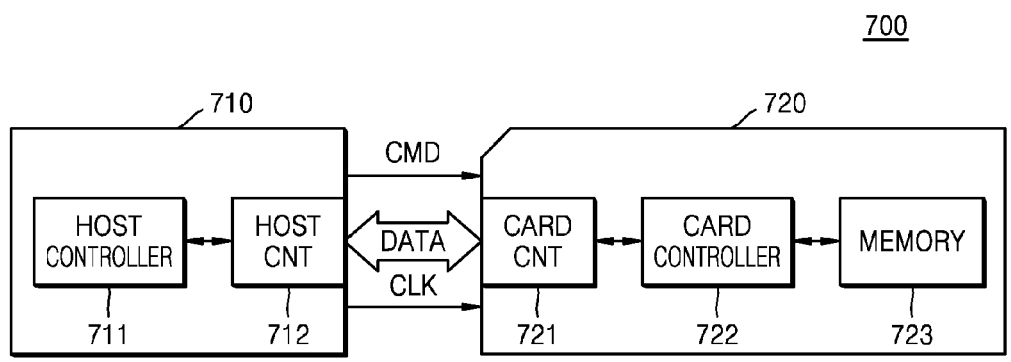
FIG. 15 is a block diagram illustrating a memory card system to which a memory system according to an embodiment of the inventive concept is applied.

FIG. 15 is a block diagram illustrating a memory card system 700 to which a memory system according to an embodiment of the inventive concept is applied. The memory system is assumed to be a resistive memory system.

Referring to FIG. 15, the memory card system 700 includes a host 710 and a memory card 720. The host 710 includes a host controller 711 and a host connector 712. The memory card 720 includes a card connector 721, a card controller 722, and a memory device 723. Here, the memory device 723 may be implemented using the embodiments shown in FIGS. 1 through 14, and accordingly the memory device 723 may minimize generation of a leakage current due to a dummy cell by detecting an address indicating a memory cell to be accessed and adjusting a level of an inhibit voltage provided to a dummy line according to a result of detecting.

The host 710 may write data to the memory card 720 or may read data stored in the memory card 720. The host controller 711 may transmit a command CMD, a clock signal CLK generated by a clock generator (not shown) in the host 710, and data DATA to the memory card 720 via the host connector 712.

In response to the command CMD received via the card connector 721, the card controller 722 may store the data DATA in the memory device 723, in synchronization with a clock signal that is generated by a clock generator (not shown) in the card controller 722. The memory device 723 may store the data DATA that is transmitted from the host 710.

The memory card 720 may be implemented as a compact flash card (CFC), a Microdrive, a smart media card (SMC), a multimedia card (MMC), a security digital card (SDC), a memory stick, or a universal serial bus (USB) flash memory drive.

Figure 16:
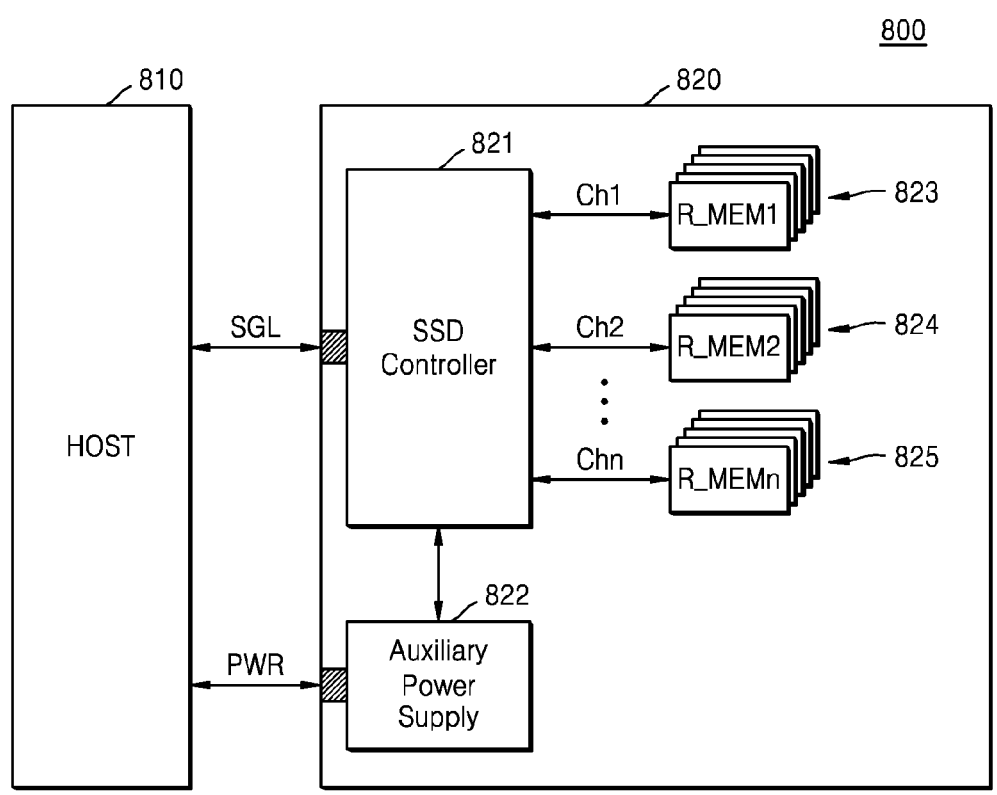
FIG. 16 is a block diagram illustrating a memory system according to embodiments of the inventive concept, applied to a Solid State Disk/Drive (SSD) system.

FIG. 16 is a block diagram illustrating a memory system according to embodiments of the inventive concept, applied to an SSD system 800.

Referring to FIG. 16, the SSD system 800 may include a host 810 and an SSD 820. The SSD 820 receives a signal from or transmits a signal to the host 810 via a signal connector, and receives power via a power connector. The SSD 820 includes an SSD controller 821, an auxiliary power supply 822, and a plurality of memory devices 823, 824, and 825. The SSD 820 may be implemented using the embodiments illustrated in FIGS. 1 through 14, and accordingly each of the memory devices 823, 824, and 825 may minimize a leakage current due to a dummy cell by detecting an address indicating a memory cell to be accessed and adjusting a level of an inhibit voltage provided to a dummy line based on a result of detecting.

Figure 17:
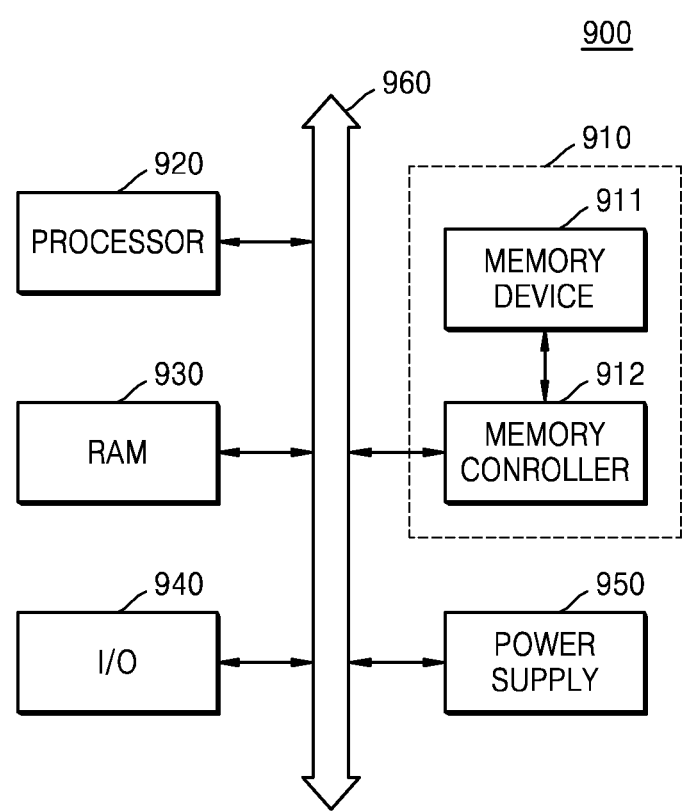
FIG. 17 is a block diagram illustrating a computing system including a memory system according to embodiments of the inventive concept.

FIG. 17 is a block diagram illustrating a computing system 900 including a memory system 910 according to embodiments of the inventive concept. The memory system 910 is assumed to be a resistive memory system.

Referring to FIG. 17, the computing system 900 includes the memory system 910, a processor 920, a RAM 930, an input/output (I/O) device 940, and a power supply device 950. The memory system 910 includes a memory device 911 and a memory controller 912. Although not illustrated in FIG. 17, the computing system 900 may further include ports capable of communicating with a video card, a sound card, a memory card, or a USB device, or other electronic devices. The computing system 900 may be embodied as a PC, or a portable electronic device such as a notebook computer, a mobile phone, a personal digital assistant (PDA), or a camera.

The processor 920 may perform particular calculations or tasks. In one or more embodiments, the processor 920 may be a micro-processor, a Central Processing Unit (CPU), or the like. The processor 920 may perform communication with the RAM 930, the I/O device 940, and the memory system 910 via a bus 960 such as an address bus, a control bus, or a data bus. Here, the memory system 910 and/or the RAM 930 may be implemented using the embodiments shown in FIGS. 1 through 14.

In one or more embodiments, the processor 920 may also be connected to an extended bus such as a Peripheral Component Interconnect (PCI) bus.

The RAM 930 may store data for operations of the computing system 900. As described above, the memory device according to the one or more embodiments of the inventive concept may be applied to the RAM 930. Alternatively, a DRAM, a mobile DRAM, an SRAM, a PRAM, an FRAM, or an MRAM may be used as the RAM 930.

The I/O device 940 may include an input unit such as a keyboard, a keypad, or a mouse, and an output unit such as a printer or a display. The power supply device 950 may supply an operating voltage for the operations of the computing system 900.

While the inventive concept has been particularly shown and described with reference to exemplary embodiments thereof, it will be understood that various changes in form and details may be made therein without departing from the spirit and scope of the following claims.

What is claimed is:

1. A method of operating a resistive memory device, wherein the resistive memory device comprises a plurality of bit lines and at least one dummy bit line, the method comprising:
   detecting a first address accompanying a first command related to a memory operation of the resistive memory device;
   generating a plurality of inhibit voltages for biasing non-selected lines from among the plurality of bit lines; and
   providing to a first dummy bit line from among the at least one dummy bit line a first inhibit voltage selected from among the plurality of inhibit voltages based on a result of detecting the first address.

2. The method of claim 1, wherein the first inhibit voltage provided to the first dummy bit line is changed based on a position of a selected bit line from among the plurality of bit lines, the position determined based on the result of detecting the first address.

3. The method of claim 1, further comprising providing to a second dummy bit line from among the at least one dummy bit line a second inhibit voltage selected from among the plurality of inhibit voltages based on the result of detecting the first address.

4. The method of claim 1, further comprising:
   detecting a second address accompanying a second command for operating the resistive memory device; and
   providing to the first dummy bit line a second inhibit voltage selected from among the plurality of inhibit voltages based on a result of detecting the second address.

5. The method of claim 1, wherein the resistive memory device further comprises a plurality of word lines and at least one dummy word line disposed to cross the plurality of bit lines,
   wherein the method further comprises providing to a first dummy word line from among the at least one dummy word line a second inhibit voltage selected from among the plurality of inhibit voltages based on the result of detecting the first address.

6. The method of claim 5, wherein a level of a selection voltage provided to a selected word line from among the plurality of word lines is changed based on the result of detecting the first address.

7. The method of claim 5, wherein when a selection voltage is provided to a side of a selected word line from among the plurality of word lines, and the side of the selected word line is a position where the first dummy bit line is disposed,
   an inhibit voltage of a relatively low level is provided to the first dummy bit line as the first inhibit voltage when a selected bit line from among the plurality of bit lines is relatively close to the first dummy bit line, and an inhibit voltage of a relatively high level is provided to the first dummy bit line as the first inhibit voltage when the selected bit line is relatively far from the first dummy bit line.

8. The method of claim 5, wherein when a selection voltage is provided to a side of a selected word line from among the plurality of word lines, and the side of the selected word line is opposite to a position where the first dummy bit line is disposed, an inhibit voltage of a relatively high level is provided to the first dummy bit line as the first inhibit voltage when a selected bit line from among the plurality of bit lines is relatively close to the first dummy bit line, and an inhibit voltage of a relatively low level is provided to the first dummy bit line as the first inhibit voltage when the selected bit line is relatively far from the first dummy bit line.

9. The method of claim 1, wherein a plurality of non-selected bit line groups from among the plurality of bit lines are disposed between the first dummy bit line and a selected bit line from among the plurality of bit lines, and an inhibit voltage identical to the first inhibit voltage provided to the first dummy bit line is provided to a non-selected bit line group from among the plurality of non-selected bit line groups that is adjacent to the first dummy bit line.

10. The method of claim 1, wherein said providing the first inhibit voltage comprises:

generating a control signal based on the result of detecting the first address; and selecting, in response to the control signal, a transfer path for the plurality of inhibit voltages to the plurality of bit lines and the first dummy bit line.

11. A method of operating a resistive memory device, wherein the resistive memory device comprises a plurality of signal lines and a dummy line, the method comprising:

receiving a command and an address related to a memory operation of the resistive memory device;

detecting the received address to determine a position of a selected signal line from among the plurality of signal lines; and applying a selection voltage to the selected signal line, and a plurality of inhibit voltages to a plurality of non-selected signal lines from among the plurality of signal lines, wherein one of the plurality of inhibit voltages is provided to the dummy line, and the inhibit voltage provided to the dummy line is changed when the detected position of the selected signal line is changed.

12. The method of claim 11, wherein an inhibit voltage identical to the inhibit voltage provided to the dummy line is provided to one of the plurality of non-selected signal lines that is adjacent to the dummy line.

13. The method of claim 11, wherein the plurality of signal lines comprise a plurality of first signal lines, and a plurality of second signal lines that are disposed to cross the plurality of first signal lines, and the dummy line comprises a first dummy line disposed parallel to the plurality of first signal lines and a second dummy line disposed parallel to the plurality of second signal lines.

14. The method of claim 13, wherein a level of an inhibit voltage provided to the first and second dummy lines is changed based on a position of a selected memory cell within the resistive memory device.

15. The method of claim 14, wherein a level of a selection voltage applied to a selected first signal line from among the plurality of first signal lines or a selected second signal line from among the plurality of second signal lines is changed based on the position of the selected memory cell, so that a write voltage or a read voltage of a constant level is provided to the selected memory cell.

16. A memory device comprising:

a memory cell array comprising a plurality of memory cells, a plurality of bit lines and at least one dummy bit line;

an address detector configured to detect an address indicative of a memory cell to be accessed from among the plurality of memory cells;

a power generator configured to generate a plurality of inhibit voltages; and a selector configured to select a first inhibit voltage from among the plurality of inhibit voltages responsive to the detected address and provide the first inhibit voltage to the at least one dummy bit line.

17. The memory device of claim 16, wherein the memory cells comprise resistive memory cells.

18. The memory device of claim 16, wherein the selector is configured to select the first inhibit voltage based on a position of a selected bit line from among the plurality of bit lines, the position determined responsive to the detected address.

19. The memory device of claim 16, wherein the address detector is further configured to detect a second address indicative of a second memory cell to be accessed from among the plurality of memory cells, and the selector is further configured to select a second inhibit voltage from among the plurality of inhibit voltages responsive to the detected second address and provide the second inhibit voltage to the at least one dummy bit line.

20. The memory device of claim 16, further comprising a plurality of word lines and at least one dummy word line, wherein the selector is further configured to select a second inhibit voltage from among the plurality of inhibit voltages responsive to the selected address and provide the second inhibit voltage to the at least one dummy word line.

* * * * *